United States Patent [19]
Nishikawa et al.

[11] Patent Number: 6,087,261
[45] Date of Patent: Jul. 11, 2000

[54] METHOD FOR PRODUCTION OF SEMICONDUCTOR DEVICE

[75] Inventors: Nobuyuki Nishikawa; Toshiya Suzuki, both of Kanagawa, Japan

[73] Assignee: Fujitsu Limited, Kawasaki, Japan

[21] Appl. No.: 09/048,177

[22] Filed: Mar. 26, 1998

[30] Foreign Application Priority Data

Sep. 30, 1997 [JP] Japan .................................. 9-265982

[51] Int. Cl.[7] ........................ H01L 21/44; H01L 21/30; H01L 21/31; H01L 21/469
[52] U.S. Cl. ..................... 438/685; 438/685; 438/398; 438/762; 427/126.3
[58] Field of Search ..................... 438/685, 398, 438/762; 427/126.3

[56] References Cited

U.S. PATENT DOCUMENTS

| | | |
|---|---|---|
| 4,792,463 | 12/1988 | Okada et al. .................... 427/126.3 |
| 5,393,565 | 2/1995 | Suzuki et al. .................... 427/255.2 |
| 5,562,952 | 10/1996 | Nakahigashi et al. ............ 427/534 |
| 5,563,090 | 10/1996 | Lee et al. ............................ 437/60 |
| 5,628,829 | 5/1997 | Foster et al. ...................... 118/723 |
| 5,834,371 | 11/1998 | Ameen et al. ..................... 438/656 |
| 5,876,788 | 3/1999 | Bronner et al. .................... 427/81 |
| 5,920,775 | 7/1999 | Koh .................................. 438/241 |
| 5,963,834 | 10/1999 | Hatano et al. ..................... 438/680 |

*Primary Examiner*—Carl Whitehead, Jr.
*Assistant Examiner*—James Park
*Attorney, Agent, or Firm*—Armstrong, Westerman, Hattori, McLeland & Naughton

[57] ABSTRACT

The method of the production of a semiconductor device including the step of forming the dielectric film on or above the semiconductor substrate, placing the semiconductor substrate and the dielectric film in the atmosphere of reduced pressure and introducing into the atmosphere of reduced pressure the reaction gas for the deposition of metal or metal nitride and the oxidizing gas thereby forming the oxygen-containing conductor film formed of metal or metal nitride on the dielectric film.

42 Claims, 19 Drawing Sheets

METHOD FOR PRODUCTION OF SEMICONDUCTOR DEVICE

BACKGROUND OF THE INVENTION

1. Field of the Invention

This invention relates to a method for the production of a semiconductor device and more particularly to a method for the production of a semiconductor device which includes a step for growing a metal film on a dielectric film.

2. Description of the Prior Art

The techniques for forming a dielectric film are broadly divided into physical methods and chemical methods. The physical methods include vacuum evaporation method, sputtering method, and ion plating method and the chemical methods include CVD (chemical vapor deposition) method, sol-gel method, liquid-phase epitaxial method, thermal spraying method, fine particle sintering method, and melt rapid quenching method.

For the film of oxide dielectric substance grown by such method to retain fine quality, it is necessary to preclude the deficiency of oxygen which causes leakage current in the film. For the replenishment of the dielectric film with oxygen, the method of thermally oxidizing the film or exposing the film to oxygen plasma is available.

The techniques for the formation of a metal film destined to function a wiring on the dielectric film include physical methods and chemical methods.

It is the sputtering method that represent the physical methods. The sputtering method consists in colliding a gas ionized in glow discharge against a target made of a component material for a thin film desired to be formed thereby forcing the target to eject particles and inducing deposition of the ejected particles on a substrate.

It is the CVD method that represents the chemical methods to deposit metal. The CVD method consists in introducing that of the compounds of component elements of a thin metal film expected to be formed which fits gasification into a high temperature furnace and enabling the introduced compound to grow a film on the surface of a substrate by dint of a relevant chemical reaction. This method ensures production of a film of crystals of still better quality because it forms the film in a state of equilibrium on the surface of a substrate.

In the field of semiconductor devices, the CVD method has been popularized in recent years because the advance of integration of circuits and the adoption of three-dimensional capacitors have come to demand a film-forming method excelling in coverage.

Most of the CVD methods for forming a metal film are carried out in a reducing or deoxidizing atmosphere and, therefore, have the possibility of extracting oxygen from the underlying film of oxide dielectric substance. This phenomenon tends to cause either degradation of dielectric constant or deterioration of crystals and high leakage current.

SUMMARY OF THE INVENTION

It is an object of this invention to provide a method for the production of a semiconductor device provided with a capacitor capable of preventing a dielectric film from deficiency of oxygen and consequently preventing the dielectric film from degradation of quality during the formation of a metal film or a conductor film of metal nitride on the dielectric film.

As concerns the method for the formation of a dielectric film for a capacitor, the feasibility of the CVD using such an organic metal as $Ta(OC_2H_5)_5$ has been extensively studied. According to the CVD method of this concept, the carbon, hydrogen, and $CH_x$ liberated by decomposition from the source inevitably mingle as impurities into the dielectric film and produce such adverse effects on the dielectric film as degrading the fastness of contact between the dielectric film and an electrode superposed thereon. It is, therefore, necessary to produce a dielectric film enjoying good quality by precluding not only the deficiency of oxygen but also such impurities.

The formation of a conductor film on the dielectric film is likewise effected by the CVD method. Since this method is frequency carried out in a reducing or deoxidizing atmosphere, it has the possibility of extracting oxygen from the dielectric film as an undercoat. This phenomenon causes degradation of dielectric constant and aggravation of leakage current and also causes deterioration of crystals of the dielectric film.

This invention contemplates supplying oxygen or an oxygen-containing gas onto a dielectric film during the formation of a conductor film made of metal or a metal compound including oxide, nitride and others on the dielectric film. The introduction of oxygen during the formation of this conductor film may be carried out not only during the formation of the conductor film but also before the formation of the conductor film or after the formation of the conductor film.

In consequence of the supply of oxygen, the dielectric film is prevented from the deficiency of oxygen, and such impurities as carbon, hydrogen, and CH are oxidized and volatilized from the dielectric film before the conductor film of metal or a metal nitride is formed on the dielectric film, As a result, the crystallinity of the dielectric film is improved and the leakage current is allayed.

When a reducing or deoxidizing gas is used as a reacting gas for the formation of the conductor film, the dielectric film is precluded from the deficiency of oxygen because the oxidizing gas originating in the supply of oxygen curbs the reducing or deoxidizing action of the reacting gas.

Another aspect of this invention comprises first supplying oxygen in a large amount onto the film of oxide dielectric substance in preparation for the formation of a conductor film of metal or metal nitride on the film of oxide dielectric substance and, while the oxygen still remains, introducing a first and a second reaction gas for the formation of the conductor film thereby decreasing the oxygen supply during the formation of the conductor film or expelling the residual oxygen from the atmosphere of reaction.

Further, during the initial stage of the formation of the conductor film, the first reaction gas, the second reaction gas, and the oxidized gas form a layer of oxygen-containing metal or oxygen-containing metal nitride in a small thickness or islands on the surface of the dielectric film. This layer formed of metal oxide or the nitride of metal oxide inhibits the oxygen in the dielectric film from diffusing in the conductor film.

After the layer of metal oxide or the nitride of metal oxide has been formed on the dielectric film, the copious supply of the oxidizing gas is no longer necessary because the supply, of the reducing or deoxidizing gas to the dielectric film is blocked by the layer of the oxygen-containing metal or the nitride of oxygen-containing metal.

It is, therefore, extremely important to mix the oxidizing gas with the first and the second reaction gas during the initial stage of the formation of the conductor film or to a stage halfway along the entire length of the duration of the formation of this film.

When the introduction of the oxygen-containing gas in a large quantity is continued during the formation of the conductor film, the oxygen content of the conductor film increases and results in adding to the sheet resistance possibly to the extent of impairing the function of the conductor film as an upper electrode. It is, therefore, important to lessen the resistance of the conductor film by lowering the partial pressure of oxygen during the formation of the conductor film. For the purpose of decreasing the resistance of the conductor film, the partial pressure of oxygen in the reaction chamber is preferred to be lowered, to or below 1.5 mTorr during the initial stage or middle, stage of the formation of the conductor film.

The partial pressure of oxygen in a reaction chamber to be maintained over the period from before the formation of the conductor film through the initial (or middle) stage of the formation of the conductor film is preferred to be on unless the order of 10 mTorr. It is preferred to be not less than 6.6 times that of the after initial or half stage of the formation of the conductor film.

Besides, it is preffered to be more than one time that of the partial pressure of second reaction gas.

The oxidizing gas is a gas which is formed of a molecule of the construction containing at least one oxygen atom. As concrete examples of the oxidizing gas which answers this description, $O_2$, $O_3$, $H_2O$, $H_2O_2$, $CO$, $CO_2$, $N_2O$, $NO$ and $NO_2$ may be cited.

DESCRIPTION OF THE PREFERRED EMBODIMENTS

Figure 1A:
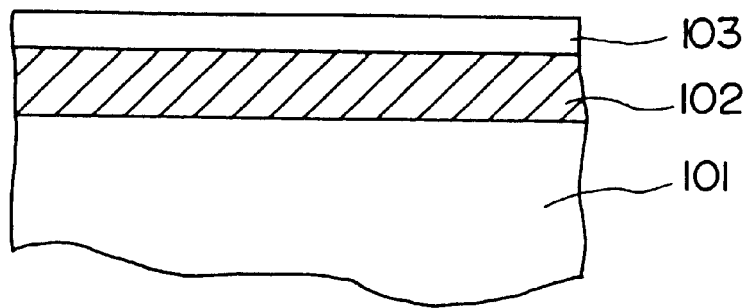
FIGS. 1A to 1B are cross sections illustrating a fundamental working example of this invention.
Figure 1B:
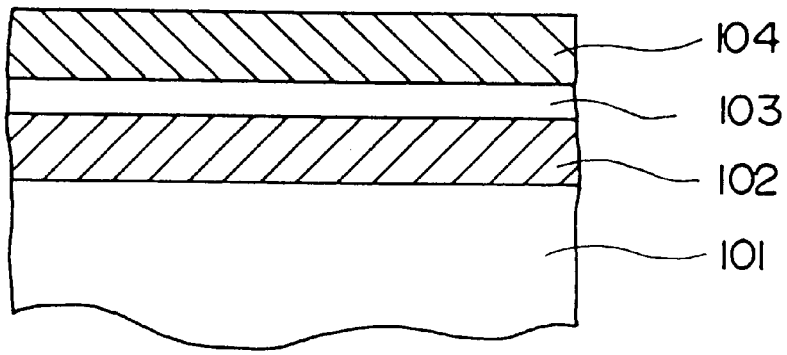
Figure 2A:
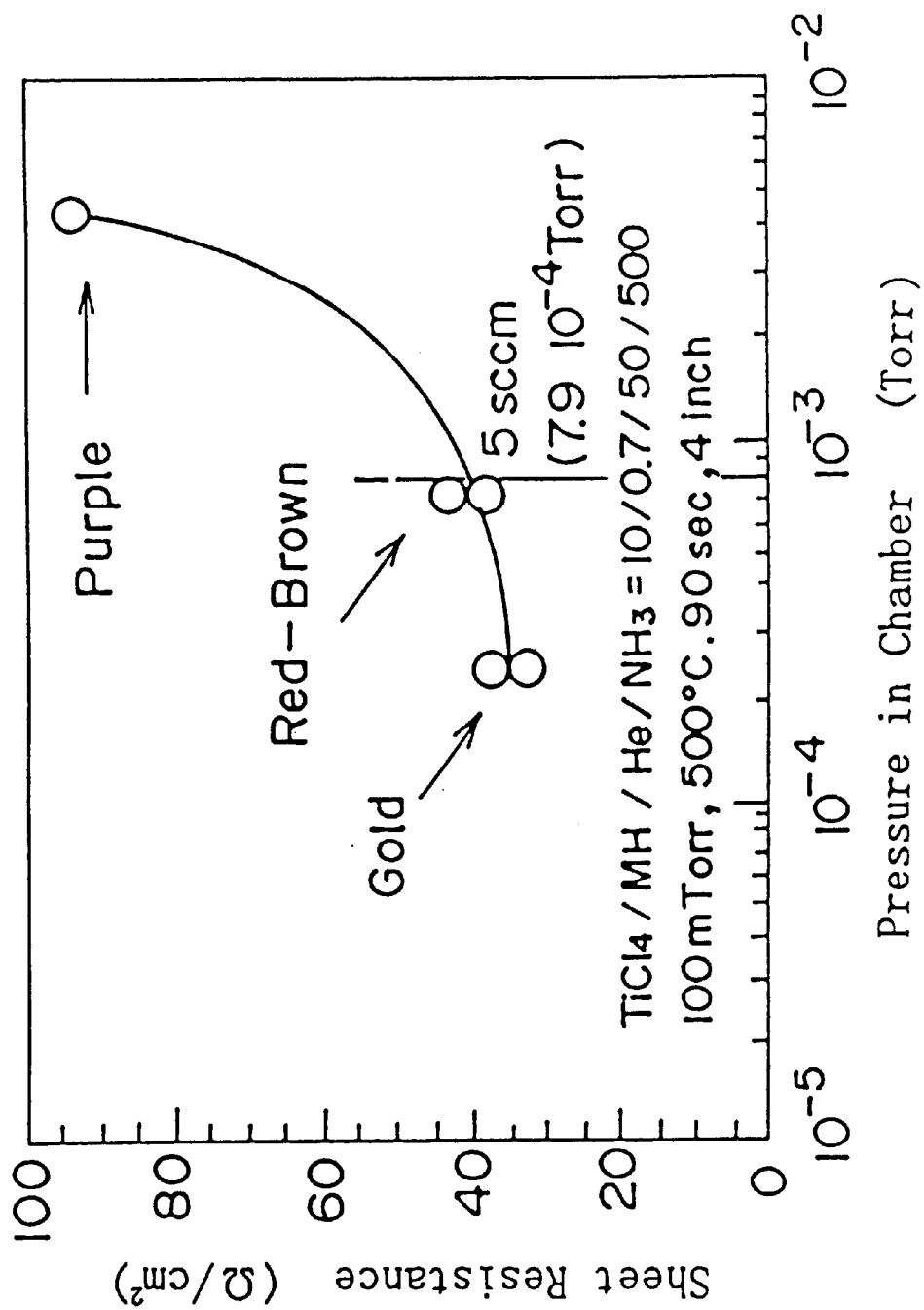
FIGS. 2A to 2B are diagrams illustrating respectively the relation between the magnitude of resistance of the metal film or the film of metal nitride to be used for this invention and the relation between the contact resistance of the metal film or the film of metal nitride and the pressure in the chamber.
Figure 2B:
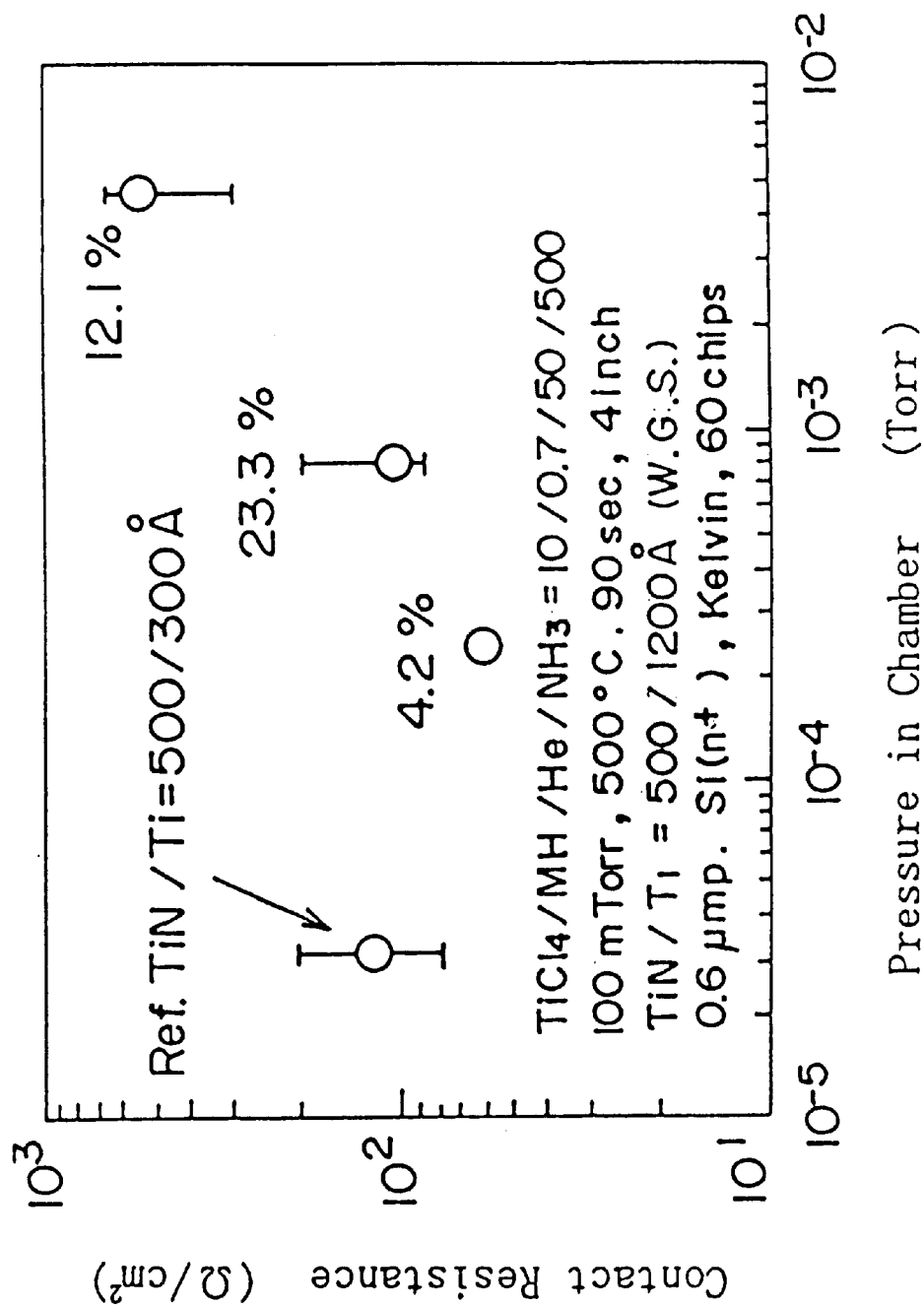

FIGS. 1A to 1B are explanatory diagrams depicting the principle of this invention and FIGS. 2A to 2B represent the pressure in the reaction chamber and the magnitude of a metal film. In FIGS. 1A and 1B, the reference numeral 101 denotes a semiconductor substrate, 102 a conductor film as a lower electrode, 103 a dielectric film, and 104 a conductor film as a to p electrode.

The present inventors propose to supply an oxidizing gas in a small quantity onto the dielectric film during the formation of an upper-layer conductor film. The deficiency of oxygen which has posed a problem to the an upper-layer conductor film is mended by supplying the oxidizing gas into the reaction chamber during the formation of a conductor wiring and the fastness of contact between the dielectric film and the film of conductor wiring is improved by displacing the impurities in the conductor wiring or the dielectric film with oxygen.

As a result, the duration of treatment for the formation of the dielectric film is curtailed and the formation of a metal wiring permits manufacture of a film of high quality which manifests a high fastness of contact to the dielectric film.

FIG. 2A represents the sheet resistance which is formed under the condition of setting the rate of evacuation of the reaction chamber of a CVD film-forming device at 80 liters/second and introducing the oxygen gas at a flow volume of 5 sccm in a vacuum of $7.9 \times 10^{-4}$ Torr in the reaction chamber.

The sheet resistance at this time is 40 $\Omega/cm^2$. If it exceeds this level, the produced film wil be unsuitable for a wiring. For the purpose of saving the dielectric substance from the deficiency of oxygen and enabling the produced dielectric film to be effectively used as a wiring, therefore, the supply of oxygen is allowed up to a flow volume of 5 sccm. The amount of oxygen to be added is preferred to be less than 1% at most relative to the amount of the raw material gas.

FIG. 2B represents the magnitude of contact resistance of the wiring formed under the condition mentioned above.

If this wiring mentioned above is used for an upper electrode of capacitor, following dielectrics are available. The oxides of the elements of group 3A, group 4A, or group 5A in the Periodic Table of the Elements or lead titanate zirconate, oxygen strontium titanate, barium strontium titanate, or strontium bismuth tantalate may be used for the dielectric film. The oxidizing gas may be a gas containing at least one member selected from among $O_2$, $H_2O$, $H_2O_2$, $O_3$, $CO$, $CO_2$, $N_2O$, $NO$ and $NO_2$. The oxidizing gas may be diluted with at least one member selected from among helium, argon, and nitrogen.

FIGS. 3A to 3D portray the mode of embodying the present invention.

Figure 3A:
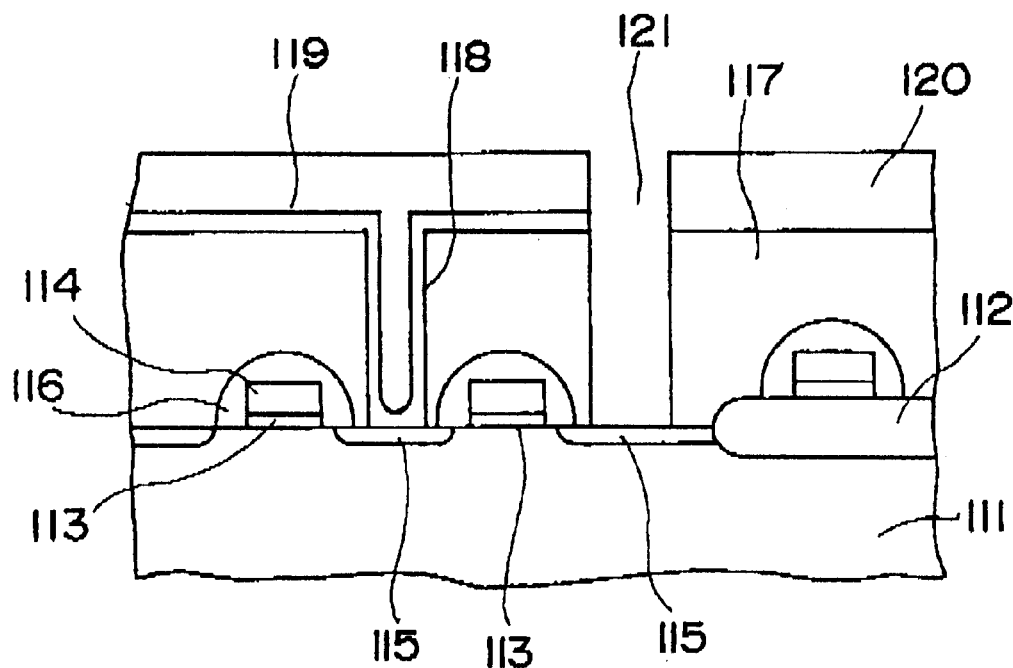
FIGS. 3A to 3D are cross sections illustrating the process of FIGS. 1A and 1B to be implemented in a process for the formation of an insulating film covering a semiconductor substrate.

As shown in FIG. 3A, a silicon substrate (semiconductor substrate) 111 contains an active region enclosed with a field oxide film 112. In this active region, a gate electrode 114 is formed as opposed to the silicon substrate across a gate oxide film 113. This gate electrode 114 extends over the field oxide film 112 and forms part of the word line. An impurity diffused layer 115 is formed on the portions of the silicon substrate 11 bordering on the opposite sides of the gate electrode 114. The gate electrode 114 is covered with a protective film 116 which is formed of silicon dioxide.

The silicon substrate 111 gate electrode 114, and protective film 116 are covered with a first interlaver insulating film 117 which is made of BPSG (boro-phospho silicate glass) In the first interlayer insulating film 117, a first glass) contact hole 118 for exposing the impurity-diffused layers 115 which intervene between a plurality of gate electrodes 114. To this first contact hole 118, a bit line 119 formed of tungsten (W) is connected. Further, the first bit line 119 and the first interlayer insulating film are covered with a second interlayer insulating film 120 formed of BPSG.

In the first and the second interlayer insulating film 117 and 120, a second contact hole 121 for exposing the impurity-diffused layer 113 intervening between the gate electrode 114 and the field oxide film 112.

Figure 3B:
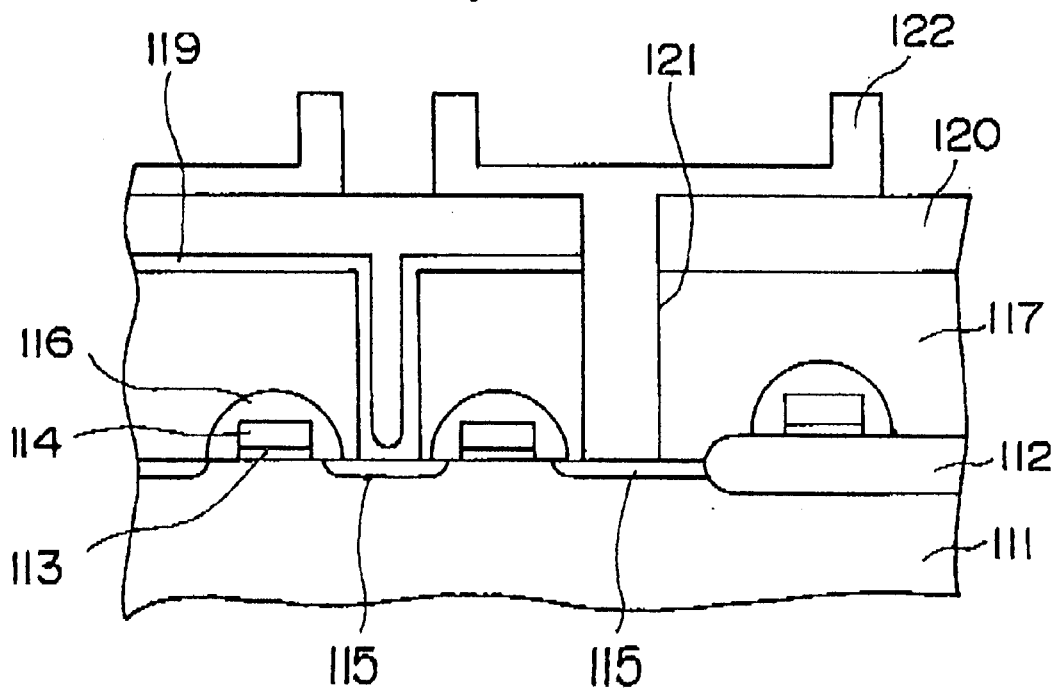

Next, as illustrated in FIG. 3B, a polycrystalline silicon film 122 is formed by the CVD method inside the contact hole 121 and on the second interlayer insulating film 120 and then it is patterned to form a storage electrode.

Figure 3C:
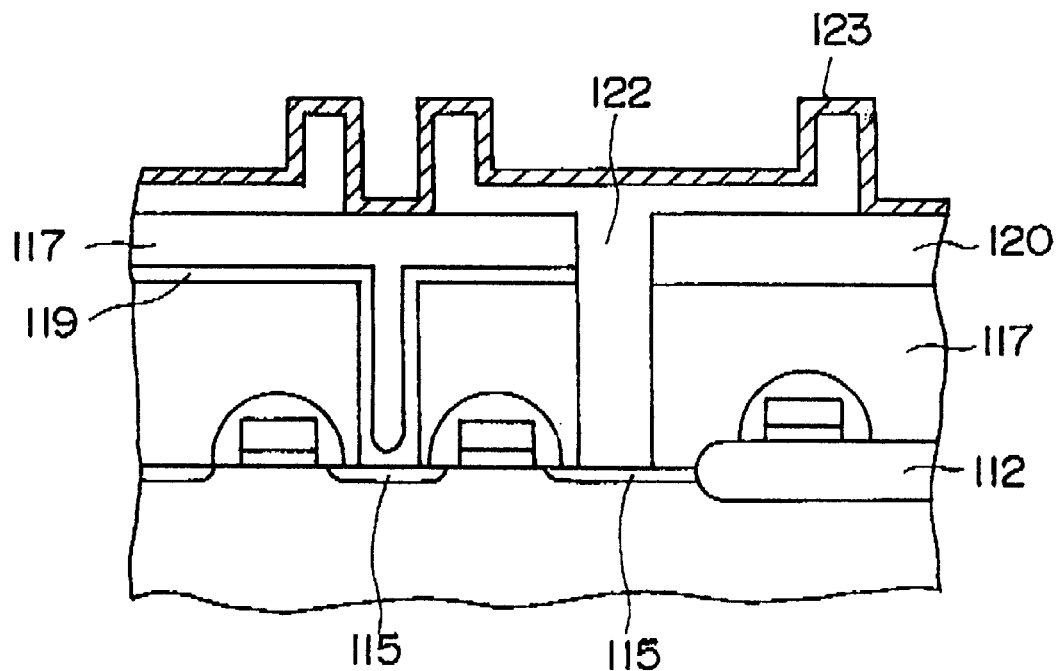

Subsequently, a $Ta_2O_5$ film 123 destined to serve as a dielectric film is formed in a thickness of 100 nm on the storage electrode as illustrated in FIG. 3C.

Figure 3D:
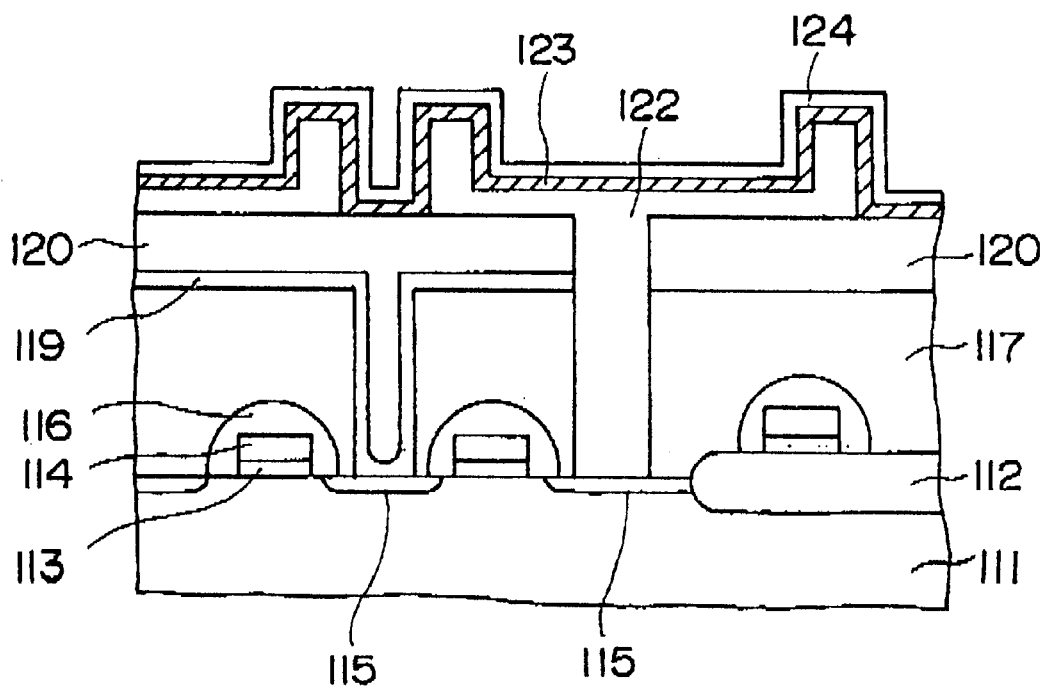

Further, as a metal wire on the dielectric film, a titanium nitride (TiN) film 124 is formed in the thickness of 100 nm by the before mentioned method resorting to the principle of CVD as illustrated in FIG. 3D. The three media, i.e. light, heat, and plasma, are available for the excitation which is required for the formation of the TiN film 124 by the CVD as contemplated by this invention.

When the excitation resorts to light as the first medium, a light of a wavelength of not more than 400 nm is projected to the excitation results in the conductor film. Decomposing the Dicyclopentadienyltitanium-diazido ($CpTi(N_3)_2$ of the source gas and inducing the optically decomposed gas to react ammonia and allowing growth of TiN. During this growth, the temperature of the silicon substrate 111 is set at 400° C. and the pressure of the film-forming atmosphere at 1 Torr. During the growth of TiN, steam ($H_2O$) is supplied at a flow volumed of 4 sccm into the film-forming atmosphere.

When the excitation resorts to heat as the second medium, the TiN is grown by a heat treatment using the gases of titanium tetrachloride ($TiCl_4$), ammonia, and monomethyl hydrazine (MMH) as the source gas. These gases, ammonia and MMH are reducing or deoxidizing gases. During the formation of the film, the substrate temperature is set at 500° C. and the pressure of the film-forming atmosphere at 150 mTorr, Before and after and during the formation of the film, the oxidizing gas is supplied to the film-forming atmosphere at a flow volume of 3 sccm.

When the excitation has resorts to plasma as the third medium, titanium tetrachloride is used as the source gas and it is relied on to generate plasma jointly with ammonia and nitrogen ($N_2$). The condition for the generation of plasma resides in the use of a high-frequency power of 13.56 MHZ and 3 kW. During the formation of the film, the substrate temperature is set at 400° C. and the pressure of the film-forming atmosphere at 500 mTorr. Before and after and during the formation of the film, the oxygen gas is supplied to the film-forming atmosphere at a flow volume of 3 sccm.

When the TiN film 124 is formed on the $Ta_2O_5$ film 123 under the condition of film formation mentioned above, the molecular composition of the $Ta_2O_5$ film 123 has its constituent elements in a stoichiometric proportion and the impurity chlorine content in the TiN film decreases to ⅕.

The example, as cited above, sets the flow volume of oxygen at a level of not more than 5 sccm and the total content of gases at a level of less than 1%. When the flow volume of the oxygen gas is on this order, the leakage current in the film of oxide dielectric substance due to the deficiency of oxygen during the formation of the upper electrode by the use of the reducing or deoxidizing gas cannot be satisfactorily allayed and the film of oxide dielectric substance itself cannot be fully improved in quality. The relevant technique, therefore, has been improved. The improved technique will be explained below.

FIGS. 4A to 4D are cross sections illustrating the process for the formation of the capacitor of the MIS (metal insulator semiconductor) type according to the embodiment of this invention.

Figure 4A:
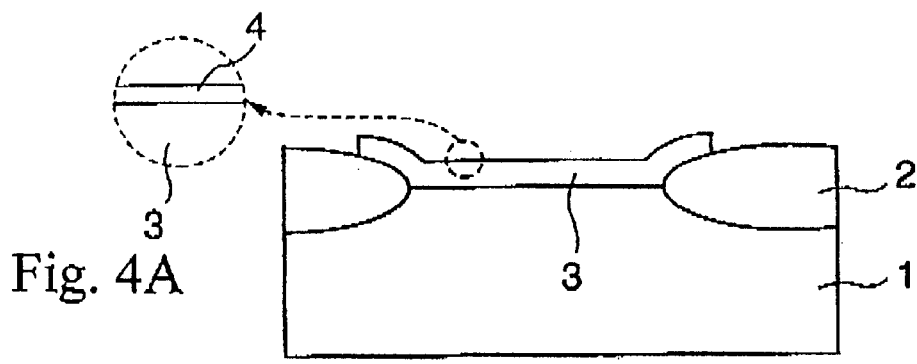
FIGS. 4A to 4D are cross sections illustrating a process for forming a MIS type capacitor according to an embodiment of this invention.
Figure 4B:
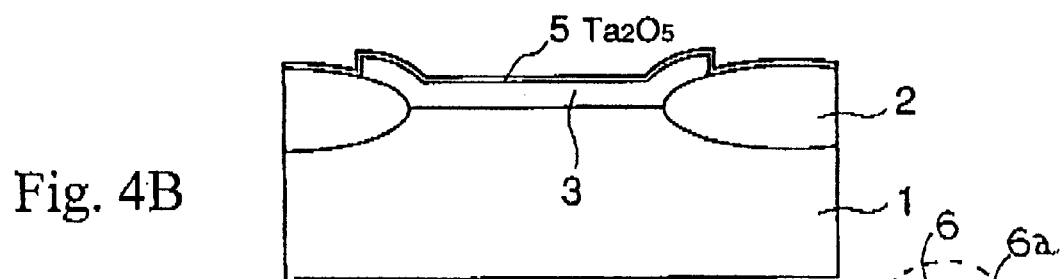

First a field oxide film 2 for encircling the domain for the formation of a capacitor is formed on the surface of a n type silicon substrate 1 as illustrated in FIG. 4A. This field oxide film 2 is formed by the selective oxidation method using a mask of silicon nitride, for example.

Subsequently, an amorphous silicon film 3 doped throughout the entire volume thereof with an impurity is formed by the CVD method in a thickness of 5 nm. The amorphous silicon film 3 is grown by using a silane type gas and the impurity is the same conductive element as used in the silicon substrate 1. In the present embodiment, phosphorus or arsenic is used.

The amorphous silicon film 3 is patterned so as to leave behind a domain for the formation of a capacitor and the vicinity thereof by the photolithographic method as illustrated in FIG. 4A.

Thereafter, the surface of the amorphous silicon film 3 is exposed to an atmosphere of ammonia ($NH_3$) to form a silicon nitride film 4 of a small thickness on the surface of the amorphous silicon film 3.

Then, a tantalum oxide ($Ta_2O_5$) film 5 is formed in a thickness of 10 nm by the CVD method on the exposed surface of the amorphous silicon film 3 and on the surface of the field oxide film 2 as illustrated in FIG., 4B. The reaction gas which is used during the growth of the $Ta_2O_5$ film 5 is $Ta(OC_2H_5)_5$ (peritaethoxytantalum), for example.

Next, the crystallinity of the $Ta_2O_5$ film 5 is improved by heating the $Ta_2O_5$ film 5 at a temperature of not less than 700° C. for several seconds in an atmosphere of oxygen. This heating in oxygen is referred to as RTO (rapid thermal oxidation). The silicon nitride film 4 prevents the amorphos silicon film 3 from the oxidizing.

It is possible employing a oxygen plasma treatment instead of RTO.

Figure 5:
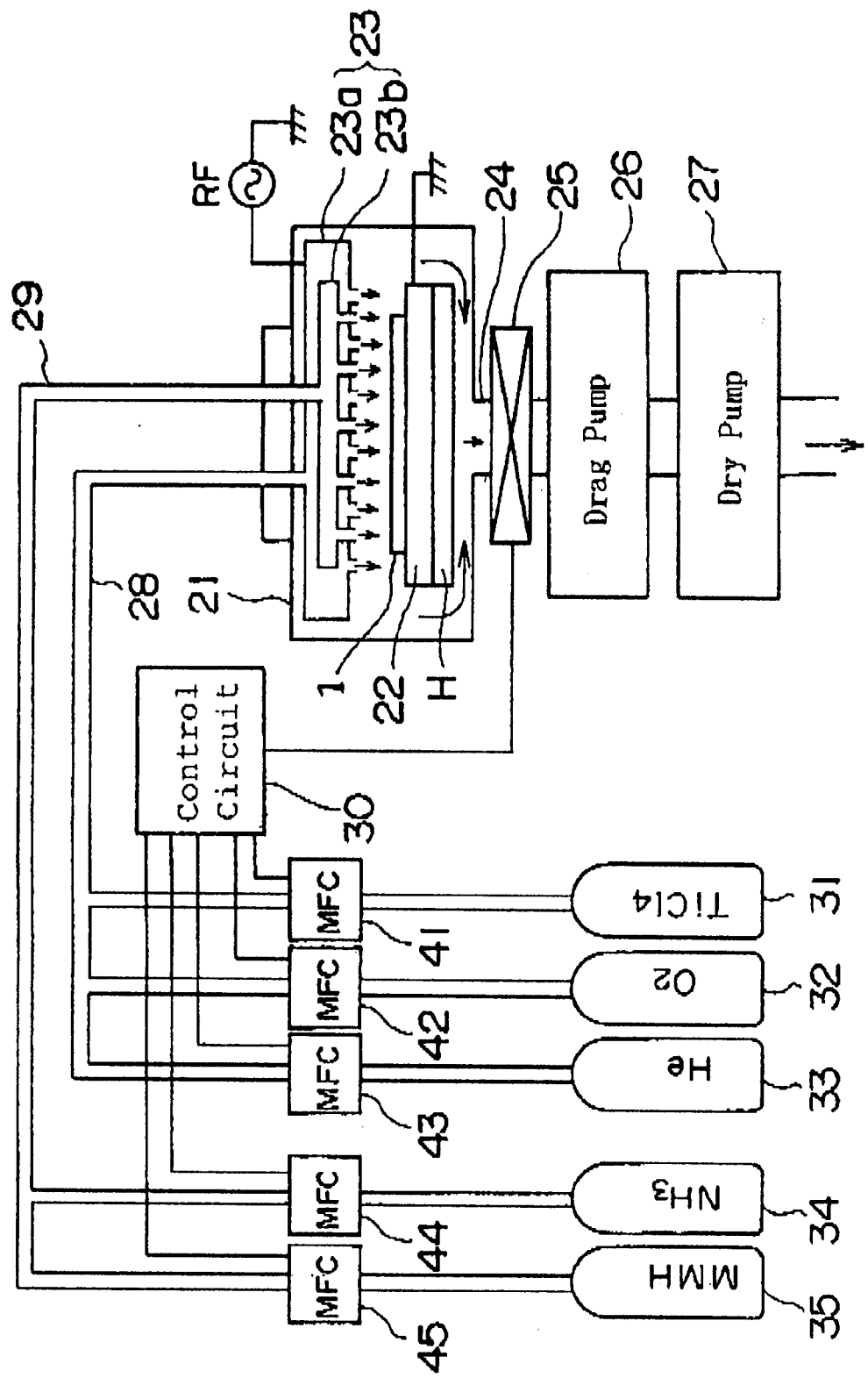
FIG. 5 is a structural diagram of a CVD device for the formation of an upper electrode of the capacitor according to an embodiment of this invention.

Then, the silicon substrate 1 is carried into the reaction chamber 21 to form the titanium nitride film on the $Ta_2O_5$ film 5, as shown in FIG. 5.

Figure 4C:
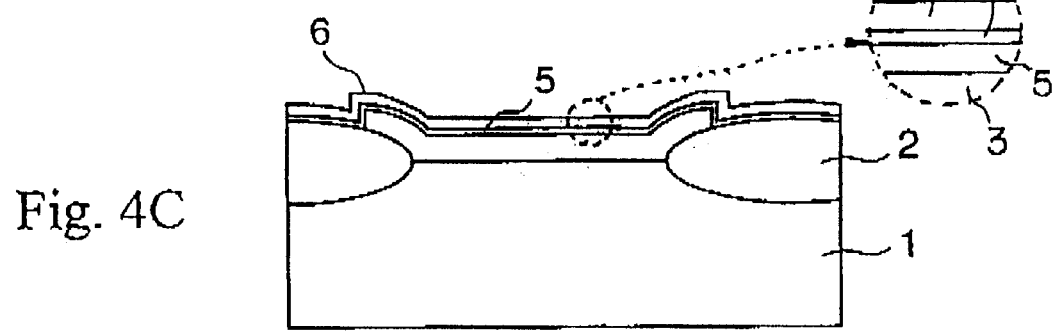

Thereafter, the oxygen gas is supplied onto the $Ta_2O_5$ film 5 and then a titanium nitiride film 6 is formed in a thickness of 50 nm by the CVD method as, illustrated in FIG. 4C. Since the supply of oxygen to the $Ta_2O_5$ film 5 is proceeding at least before the growth of the titanium nitride film 6, the titanium nitride film 6 which experiences this situation will be referred to herein after as "titanium nitride film formed by oxygen preflow deposition."

Subsequently, the silicon substrate 1 is extracted from the atmosphere of low pressure or vacuum pressure and then the titanium nitride film 6 is patterned by the photolithographic method in such a manner as to leave behind the, part thereof overlying the amorphous silicon film 3 and the part thereof overlying the field oxide film 2 which adjoins the amorphous silicon film 3. The reaction gases to be used for this patterning are $Cl_2$ (chlorine) and $BCl_3$ (boron trichloride). With these gases, the patterning of the titanium nitride film 6 can be easily carried out. These gases are the same as those which are used for patterning the TiN film described in the column dealing with the prior art.

This patterning completes the basic structure of the MIS type capacitor using the amorphous silicon film 3 as the lower electrode the $Ta_2O_5$ film 5 as the dielectric film 25 and the titanium nitride film 6 formed by oxygen preflow deposition as the upper electrode.

Figure 4D:
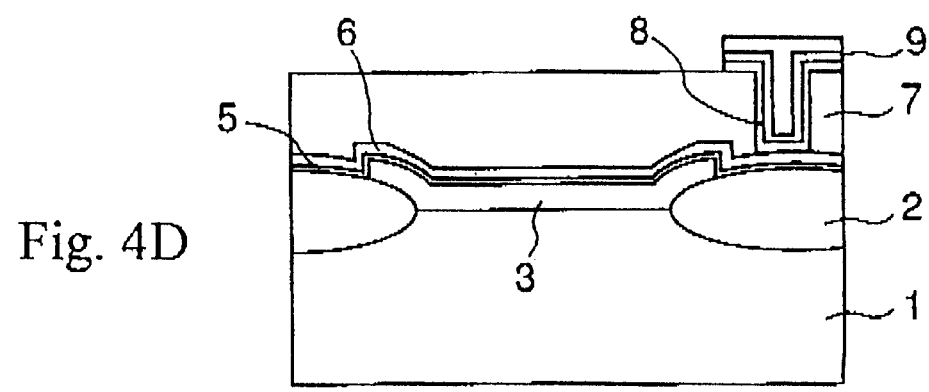

Further, a $SiO_2$ film 7 for covering the titanium nitride film 6. The $SiO_2$ film 7 is formed by the plasma CVD method using gasified TEOS (tetraethoxy silane). Subsequently, the $SiO_2$ film 7 is pattern by the photolithographic method so as to form an opening part 8 for exposing part of the titanium nitride film 6, which overlies the field oxide film 2 as illustrated in FIG. 4D.

A wiring 9 is then formed on the $SiO_2$ film 7. Part of this wiring 9 is passed through the opening part 8 and connected to the titanium nitride film 6. This wiring 9 is in a three-ply structure having Ti, TiN, and AlCu superposed sequentially upward from below.

The process described above completes the process for the formation of a capacitor on the silicon substrate 1.

Now, the method for forming the titanium nitride film 6 illustrated in FIG. 4C will be described. The growth of this film is effected by the use of such a CVD device as illustrated in FIG. 5 under the condition illustrated in FIG. 6.

Inside a reaction chamber 21 of the CVD device illustrated in FIG. 5, a lower electrode 22 concurrently serving as a base for mounting a substrate and a gas shower 23 opposed to the lower electrode 22 across a gap are laid out. The gas shower 23 is provided with a first gas diffusion chamber 23a and a second gas diffusion chamber 23b. A plurality of gas release holes formed on the lower side of the first gas diffusion chamber 23a and a plurality of gas release holes formed in the second gas shower 23 are severally exposed through the bottom part of the gas shower 23 . The gas shower 23 further function as an upper 17 electrode and is electrically connected to a radio-frequency power source RF. To a gas outlet 24 in the bottom part of the reaction chamber 21 are connected a switch valve 25, a drag pump 26, and a dry pump 27. These, parts are adapted to decompress the interior of the reaction chamber 21.

To the first gas diffusion chamber 23a of the gas shower 23, a first gas pipe 28 bound to first–third gas cylinders 31–33 is connected. To the second gas diffusion chamber 23b, a second gas pipe 29 bound to fourth and fifth gas cylinders 34 and 35 is connected.

The first gas cylinder 31 is packed with titanium tetrachloride gas ($TiCl_4$). The operations for adjusting the flow volume of this gas, starting the supply thereof, and stopping the supply thereof are controlled by a first mass flow controller 41 via a control circuit 30. The second gas cylinder 32 is packed with oxygen ($O_2$) gas. The operations for adjusting the flow volume of this gas, starting the supply thereof, and stopping the supply thereof are controlled by a second mass flow controller 42 via the control circuit 30. The third gas cylinder 33 is packed with helium (He) gas. The operations for adjusting the flow volume of this gas, starting the supply thereof, and stepping the supply thereof are controlled by a third mass flew controller 43 via the control circuit 30.

The fourth gas cylinder 34 is packed with MMH (momomethyl hydrazine) gas. The operations for adjusting the flow volume of this gas, starting the supply thereof, and stopping the supply thereof are controlled by a fourth mass flow controller 44 via the control circuit 30. The fifth gas cylinder 35 is packed with ammonia ($NH_3$) gas. The operations for adjusting the flow volume of this gas, starting the supply thereof, and stopping the supply thereof are controlled by a fifth mass flow controller 45, via the control circuit 30.

Figure 6:
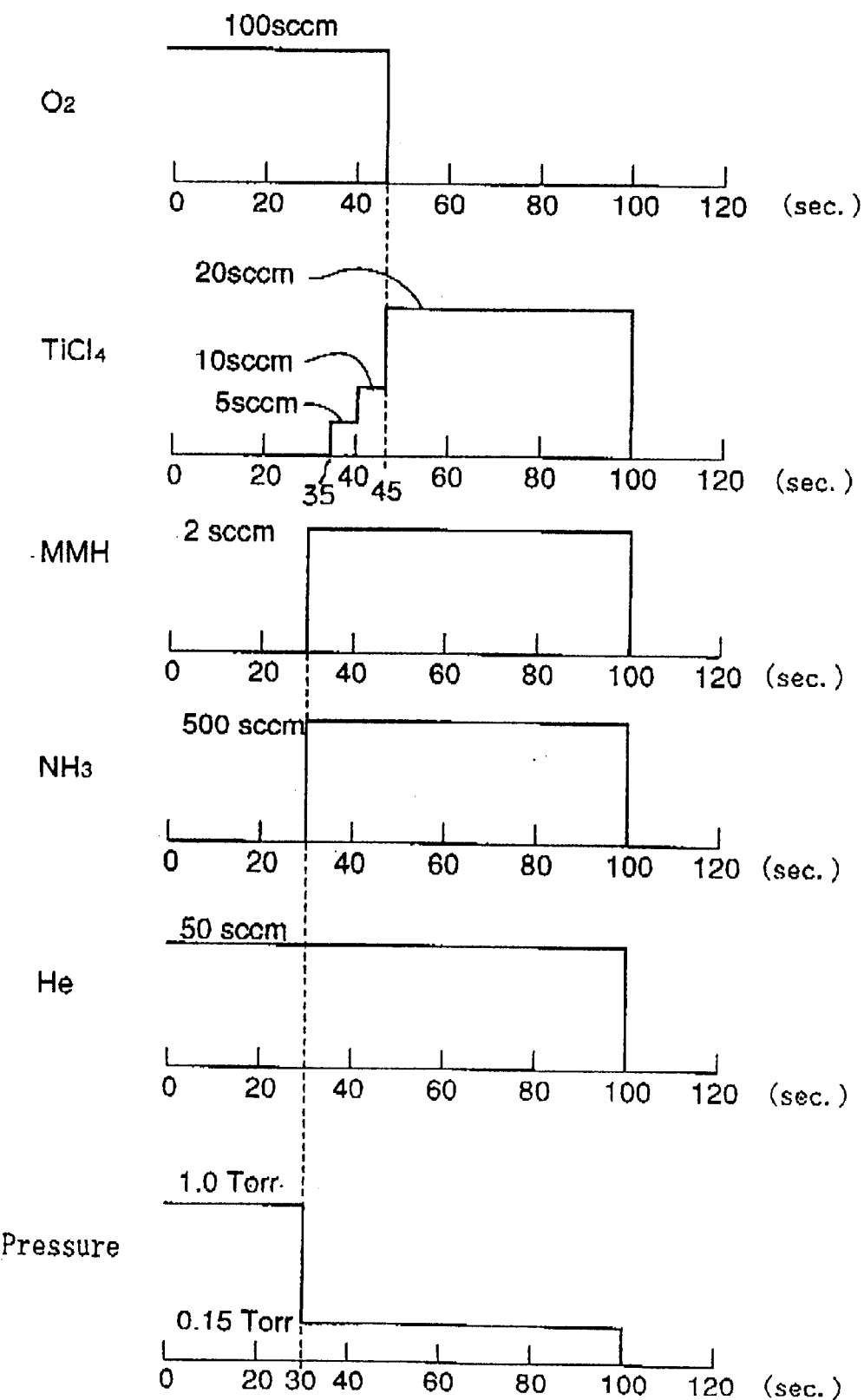
FIG. 6 is a diagram illustrating the first gas flow chart A for the gas and pressure in the growth of a metal film destined to form the upper electrode shown in FIG. 4C.

For the formation of the titanium nitride film 6 by the use of the CVD device constructed as described above, the control circuit 30 controls the first–fifth mass flow controllers 41–45 so as to effect the operations for adjusting the flow volume of this gas, starting the supply thereof, and stopping the supply thereof and establish such a flow as illustrated in FIG. 6, for example. These operations will be described below.

First, after the silicon substrate 1 has been placed on the lower electrode 22 inside the reaction chamber 21 of the CVD device, the switch valve 25 is opened to decompress the interior of the reaction chamber 21 by means of the drag pump 26 and the dry pump 21 and the heater H below the lower electrode 22 is turned on to set the temperature of the silicon substrate 1 at 500° C.

In the ensuant condition, the second and the third mass flew controller 42 and 43 are actuated to supply the oxygen ($O_2$) gas and helium (He) gas at respective flow volumes of 100 sccm and 50 sccm into the reaction chamber 21 and meanwhile the pressure inside the atmosphere of low or vacuum pressure is set at 1.0 Torr as illustrated in FIG. 6.

By adding oxygen in a large quantity to the interior of the reaction chamber 21 as described above, the interior of the reaction chamber 21 is set at an ample atmosphere of oxygen and the reduction or deoxidation of the $Ta_2O_5$ film 5 during the subsequent introduction of ammonia ($NH_3$) gas and monomethyl hydrazine (MMH) is prevented. The atmosphere of oxygen under a low or vacuum pressure brings about an additional effect of bonding the carbon or hydrogen atoms contained in the $Ta_2O_5$ film 5 with oxygen atoms thereby producing voltile $CO_x$ or $H_2O$ and expelling the carbon or hydrogen from the $Ta_2O_5$ film 5 through evaporation and consequently heightening the crystallinity of the $Ta_2O_5$ film 5 and decreasing the leakage current. It further has an effect of displacing the impurity such as, for example, chlorine contained in the TiN film 6 with oxygen.

In this case, the flow volume of the oxygen gas is amply increased above 5 sccm to ensure diffusion of the oxygen in the $Ta_2O_5$ film 5.

After the elapse of 30 seconds following the start of supply of oxygen and helium, the fourth and the fifth mass flow controller 44 and 45 are, opened to introduce the $NH_3$ gas and MMH gas at respective flow volumes of 50 sccm and 2 sccm into the chamber 21 and, at the same time, the pressure of the atmosphere of low or vacuum pressure is set at 0.15 Torr as shown in FIG. 6. Further after the elapse of 35 seconds following the start of supply of oxygen, the first mass flow controller 41 is opened to introduce the $TiCl_4$ gas at a flow volume of 5 sccm into the chamber 21, as shown in FIG. 6. After the elapse of five seconds following the start of introduction of the $TiCl_4$ gas, the flow volume of the $TiCl_4$ is increased to 10 sccm. Further, after the elapse of 10 seconds following the start of introduction of the $TiCl_4$ gas, the flow volume of the $TiCl_4$ is increased to 20 sccm.

At the same time that the flow volume of the $TiCl_4$ gas to 20 sccm, namely after the elapse of 45 seconds following the start of introduction of oxygen, the second mass flow controller 42 is adjusted to stop the supply of the oxygen gas to the chamber 21. This procedure prevents the $Ta_2O_5$ film from being deoxidizing or reduced and permits formation of TiN of high oxygen concentration in the interface with the TiN film 6. Since the TiN film 6 which has been formed after the stop of supply of oxygen incorporates no oxygen therein, it offers low resistance.

The main growth of the titanium nitride (TiN) film 6 is started at the same time increasing the $TiCl_4$ gas to 20 sccm.

After the elapse of 55 seconds following the start of growth of the titanium nitride film 6, the valves in the first, third, fourth, and fifth mass flow controller 42 and 43–45 are closed and the supply of $TiCl_4$, MMH, $NH_3$, and He gases is stopped to terminate the growth, of the titanium nitride film 6. As a result, the pressure in the low or vacuum atmosphere is lowered more.

The titanium nitride film 6 is formed under the conditions of gas control described above. This titanium nitride film 6 is an titanium nitride film formed by oxygen preflow deposition and the lower layer part of the titanium nitride film contains oxygen. A $TiO_x$ or TiON film 6a is formed exclusively in the interface between the $Ta_2O_5$ film 5 and the TiN film 6 as illustrated in FIG. 4C.

Figure 7:
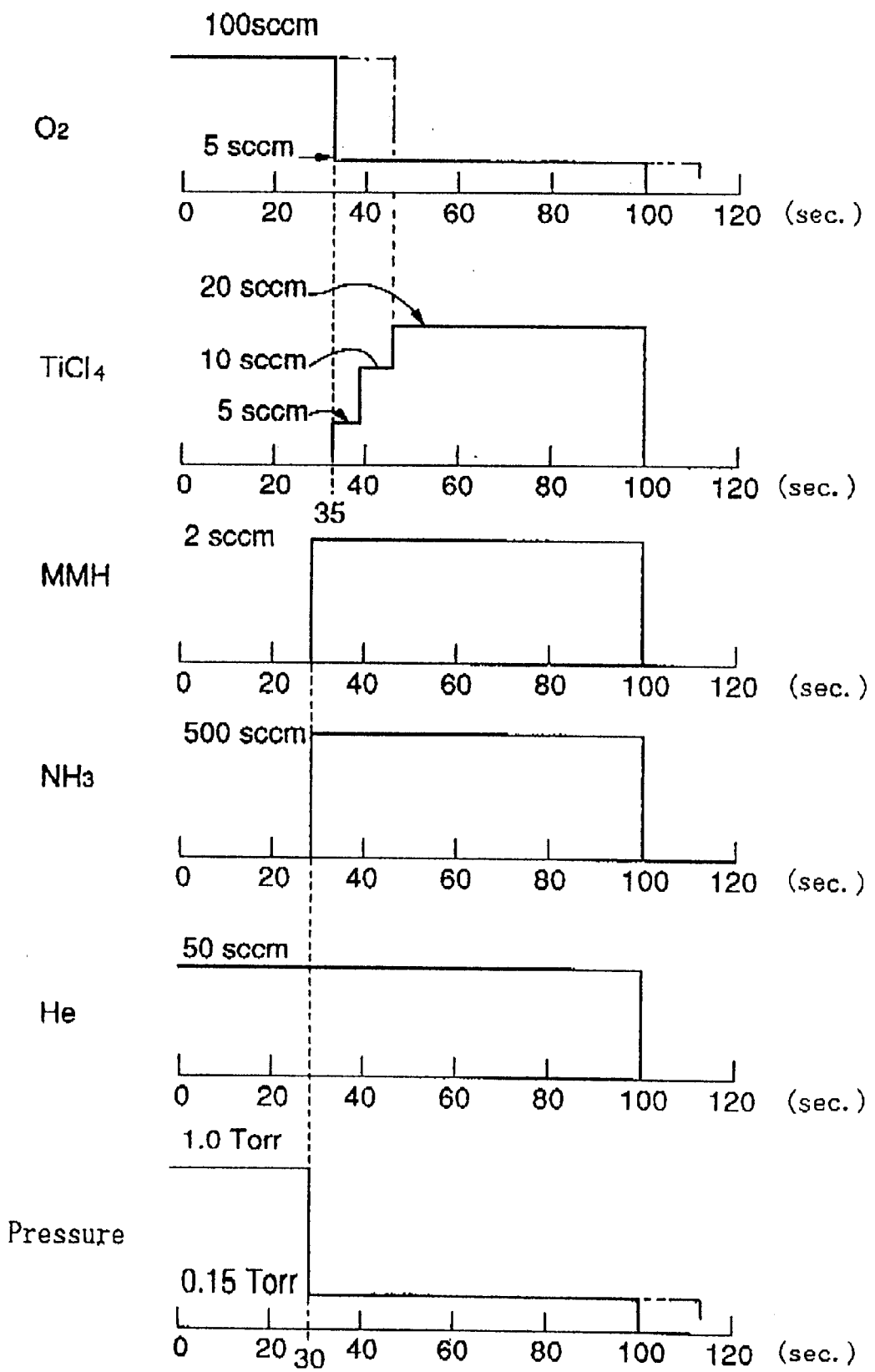
FIG. 7 is a diagram illustrating the second gas flow chart B for the gas and pressure in the growth of the metal film destined to form the upper electrode shown in FIG. 4D.

The conditions for the growth of titanium nitride on the $Ta_2O_5$ film 5 do not need to be limited to those illustrated in FIG. 6. Optionally, a trace quantity of oxygen may be introduced into the atmosphere of low or vacuum pressure during the growth of the titanium nitride film as illustrated in FIG. 7, for example. The film which is consequently formed is a titanium nitride film containing oxygen (TiON) throughout its entire volume from the lower layer part to the upper layer part.

Figure 8A:
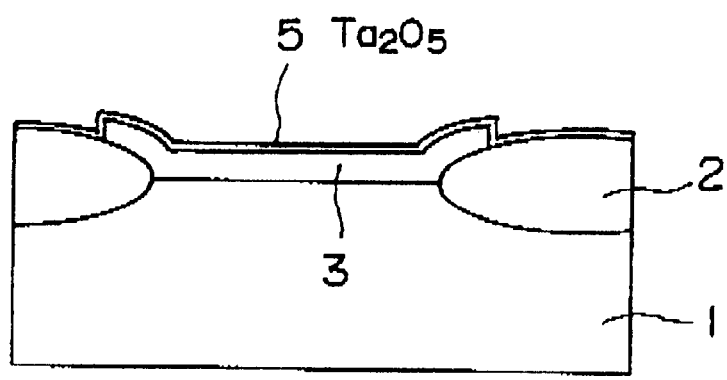
FIGS. 8A and 8B are cross sections illustrating a process for the formation of the upper electrode of the capacitor with reference to the second gas flow chart illustrated in FIG. 7.

FIG. 7 depicts the same gas flow conditions as are shown in FIG. 6 excepting the oxygen gas. Specifically, the silicon substrate 1 on which the $Ta_2O_5$ film 5 has been formed is placed in the reaction chamber 21 of low or vacuum pressure as illustrated in FIG. 8A. After the substrate temperature has been set at 500° C. in the atmosphere of low or vacuum pressure, the $O_2$ gas and the He gas are supplied at respective flow volumes of 100 sccm and 50 sccm to the atmosphere of low or vacuum pressure and, at the same time, the pressure in the atmosphere of low or vacuum pressure is set at 1.0 Torr.

After the elapse of 30 seconds following the start of supply of $O_2$ and He, the $NH_3$ gas and the MMH gas are introduced at respective flow volumes of 500 sccm and 2 sccm te the atmosphere of low or vacuum pressure and, at the same time, the pressure of the atmosphere of low or vacuum pressure is lowered to 0.15 Torr.

Further after the elapse of 35 seconds following the start of supply of oxygen, Further after the elapse of 35 seconds following the start of supply of oxygen, the introduction of the $TiCl_4$ gas at a flow volume of 5 sccm into the atmosphere of low or vacuum pressure is started and, at the same time, the flow volume of the oxygen gas is decreased to 5 sccm.

Figure 8B:
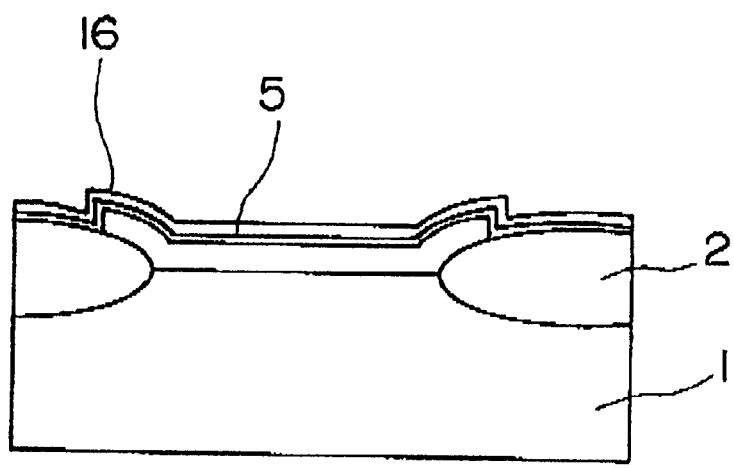

The flow volume of the $TiCl_4$ gas is increased to 10 sccm after the elapse of five seconds following the start of introduction of the $TiCl_4$ gas. Further, the flow volume of the $TiCl_4$ gas is increased up to 20 sccm after the elapse of 10 seconds following the start of introduction of the $TiCl_4$ gas. As a result, the oxygen-containing titanium nitride film 16 is formed as illustrated in FIG. 8B.

The growth of the oxygen-containing titanium nitride (TiON) film 16 is started at the time that the introduction of the $TiCl_4$ gas is started. After the elapse of 55 seconds following the start of growth of the TiON film 16, the introduction of the gases of $O_2$, $TiCl_4$, MMH, $NH_3$, and He is stopped to terminate the growth of the TiON film 16. As a result, the gas pressure in the atmosphere of low or vacuum pressure is lowered.

When the flow volume of oxygen is not more than 5 sccm, the stop of the introduction mentioned above may be effected after the formation of the TiON film 16 as indicated by a two-dot line in FIG. 7.

Figure 9:
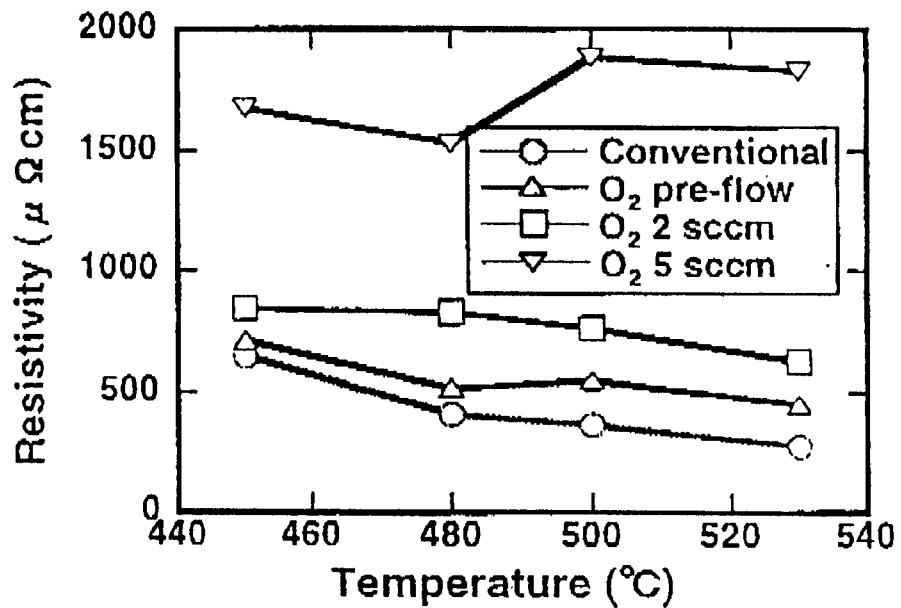
FIG. 9 is a diagram showing the relation between the growth temperature and the specific resistance concerning the titanium nitride film formed by oxygen preflow deposition to be used in this invention, the film of a nitridized titanium oxide to be used in this invention, and the film of titanium nitride according to the conventional technique.
Figure 10:
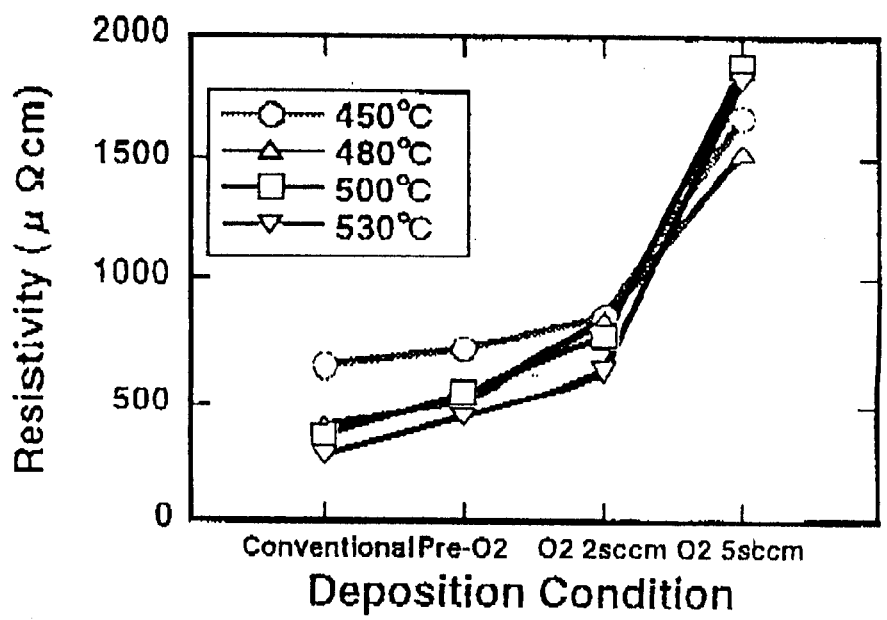
FIG. 10 is a diagram showing the difference in the several specific resistances of the film of an oxygen preflow titanium nitride te be used in this invention, the film of a nitridized titanium oxide to be used in this invention, and the film of titanium nitride according to the conventional technique.

An investigation conducted on the relation of the specific resistance and the temperatures of the titanium nitride film 6 formed by oxygen preflow deposition, oxygen-containing titanium nitride film formed under conditions yielding such as shown in FIG. 7, and titanium nitride film formed under conventional method are shown in FIG. 9 and FIG. 10. In the diagrams of FIG. 9 and FIG. 10, the plots of ○ represent the values of specific resistance of the titanium nitride film containing substantially no oxygen, the plots of Δ represent the values of specific resistance of the titanium nitride film formed by oxygen preflow deposition formed under the conditions shown in FIG. 6, the plots of □ represent the values of specific resistance of the titanium oxygen nitride film formed in the reaction chamber 31 having oxygen introduced at a flow volume of 2 sccm as shown in FIG. 7, and the plots ▽ represent the values of specific resistance of the titanium oxygen nitride formed in the reaction chamber 31 having oxygen introduced at a flow volume of 5 sccm as shown in FIG. 7.

It is noted from FIG. 9 that the titanium nitride film formed by oxygen preflow deposition, oxygen-containing titanium nitride film, and titanium nitride film manifest substantially invariable values of specific resistance without being affected by their relevant temperatures of growth. FIG. 10 derived from FIG. 9 by redrawing the horizontal axis in terms of the condition of growth allows comparison of the values of specific resistance varied by the difference in the condition of growth.

The oxygen-containing titanium nitride film formed in accordance with the gas flow of FIG. 7 contains oxygen slightly throughout the entire volume and, therefore, yielded greater resistance than the titanium nitride film 6 formed by oxygen preflow deposition formed in accordance with the gas flow of FIG. 6. So long as the specific resistance is not more than 2000 $\mu\Omega$cm, the capacitor sufficiently fulfills its function as an upper electrode. The flow volume of oxygen not exceeding 5 sccm, therefore, does not pose any serious problem.

When the second mass flow controller 42 is adjusted so that the flow volume of oxygen shows a value of 5 sccm before the formation of the TiON film 16, however, the flow volume of oxygen to the $Ta_2O_5$ is unduly small.

In a initial stage of forming the TiON film 16, the flow volume of oxygen not exceeding 5 sccm does not form a protecting film between $Ta_2O_5$ film 5 and the TiON film 16 to protect the $Ta_2O_5$ film 5 from deoxidizing atmosphere substantially and does not improve the film quality of the $Ta_2O_5$ film fully. Before and during the formation of the TiON film 16, therefore, the flow volume of oxygen must be decreased stepwise to 100 sccm as indicated by a solid line or an alternate dash and dot line in FIG. 7.

A comparison of the titanium nitride film formed by oxygen preflow deposition with the TION film formed by introducing oxygen at 2 sccm and the equivalent film formed by the conventional technique completely omitting the introduction of oxygen reveals practically no change in the value of specific resistance as clearly noted from FIG. 9 and FIG. 10.

Figure 11:
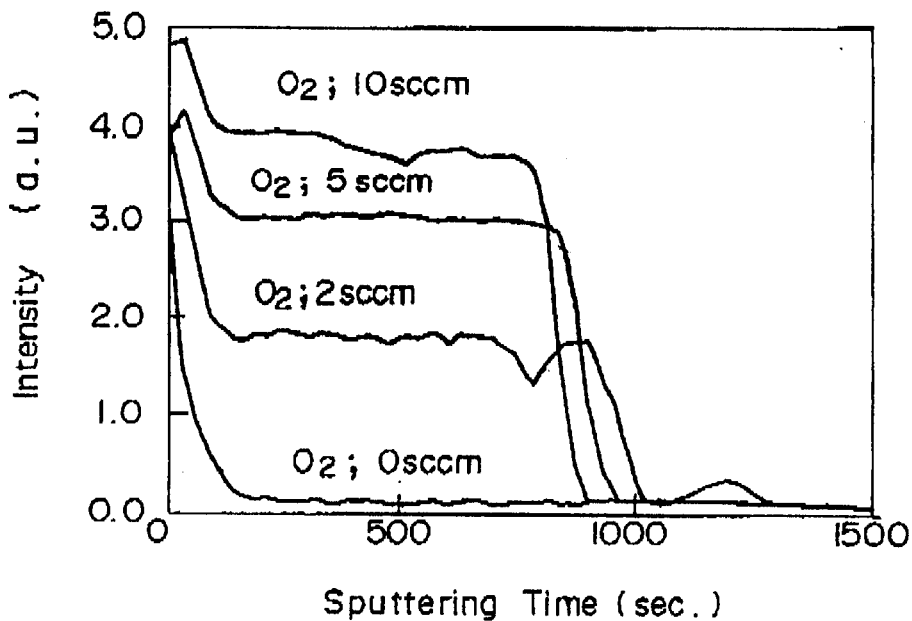
FIG. 11 is a diagram showing the difference between the oxygen content of the film of the nitridized titanium oxide to be used in this invention and the oxygen content of the film of titanium nitride according to the conventional technique.
Figure 12:
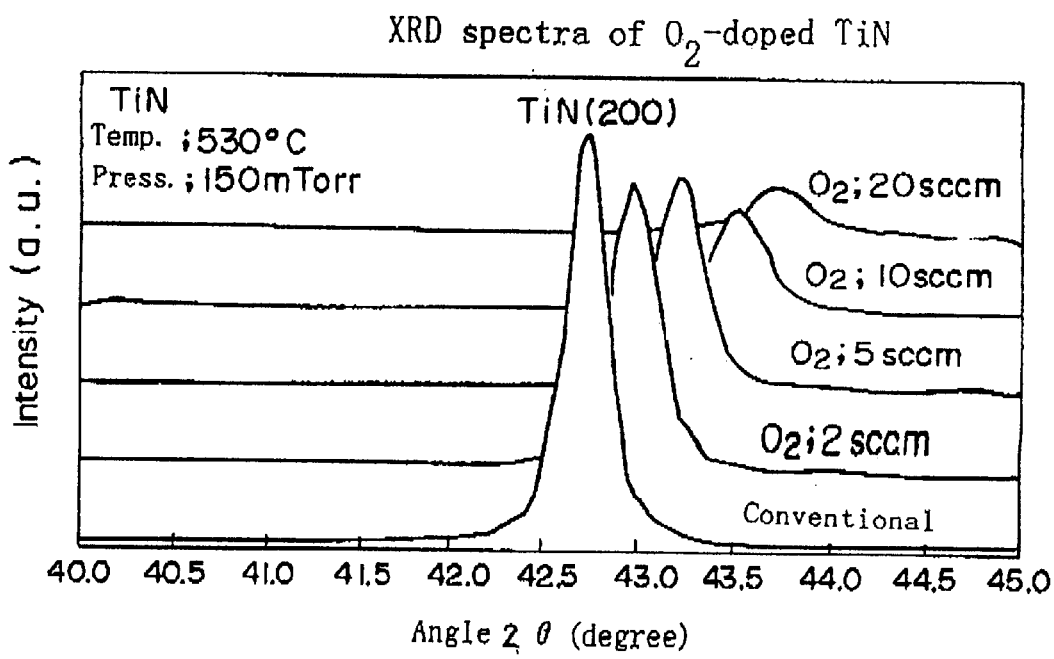
FIG. 12 is an XRD spectrum diagram showing the differences in the oxygen content of the film of nitridized titanium oxide te be used in this invention and in the crystal structure of the film of titanium nitride according to the conventional technique.

A review of the relation between the flow volume of oxygen during the growth of the oxygen-containing titanium nitride film 16 and the oxygen content in the oxygen-containing nitride film 16 yields the data shown in FIG. 11. This fact establishes that the adjustment of the flow volume of oxygen allows control of the oxygen content in the TiON film 16, FIG. 11 depicts the case of lowering the flow volume of oxygen during the growth of the oxygen-containing nitride film 16 to 2 sccm, 5 sccm, 10 sccm, and 0 sccm. A perusal of the XRD (X-ray diffraction) spectrum shown in FIG. 12 reveals that the departure of the oxygen-containing titanium nitride from TiN crystals grows in accordance as the flow volume of oxygen is increased.

Now, the outcomes of the comparison between the leakage of the titanium compound (the upper electrode) grown on the $Ta_2O_5$ film 5 in accordance with the gas flow charts of FIG. 6 and FIG. 7 and the leakage current of the titanium nitride formed by the conventional method will be explained below.

The following explanation presumes that the gas flow chart A depicts the conditions shown in FIG. 6 and the gas flow chart B depicts the conditions shown in FIG. 7. The conventional technique resides in forming a capacitor by growing a TiN film on a $Ta_2O_5$ film under the same conditions as shown in FIG. 6 and FIG. 7, excepting it omits the introduction of oxygen.

Incidentally, for the formation of the upper electrode in according with the conventional technique, the method disclosed in R. Tamaru et al., Proceedings of VMIC (1997), p. 571 was adopted in the comparison.

Figure 13:
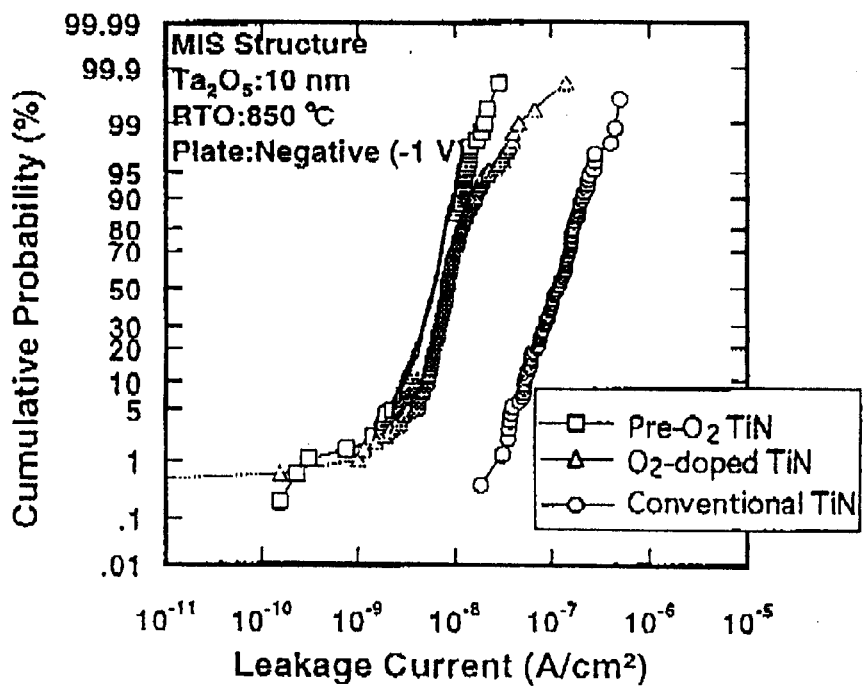
FIG. 13 is a first characteristic diagram showing the leakage current in the MIS type capacitor of the construction shown in FIG. 40 and the leakage current in the MIS type capacitor formed by the conventional method.

FIG. 13 shows the leakage current which occurred in the capacitor when the voltage was applied to the capacitor with the amorphous silicon film 3 on the plus side and the wiring 9 on the minus side. It is noted from the data that the capacitor of the present embodiment formed by the process embracing the gas flow chart A or B showed a leakage current indicating a decrease by a fall of one decimal position from the leakage current in the capacitor formed by the conventional technique.

Figure 14:
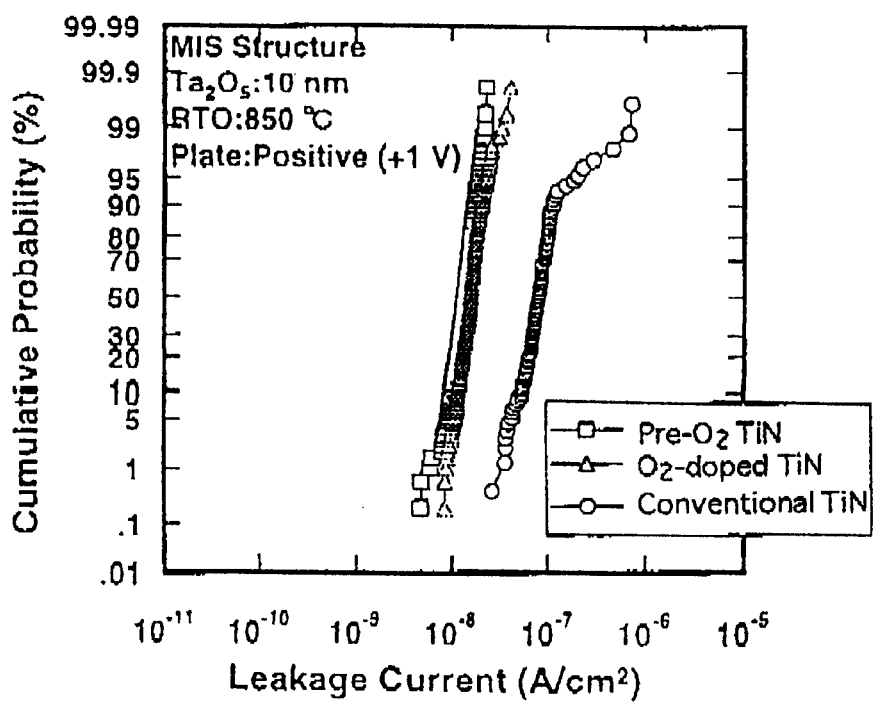
FIG. 14 is a second characteristic diagram showing the leakage current in the MIS type capacitor of the construction shown in FIG. 4D and the leakage current in the MIS type capacitor formed by the conventional method.

FIG. 14 shows the leakage current which occurred in the capacitor when the voltage was applied to the capacitor with the amorphous silicon film 3 on the minus side and the wiring 9 on the plus side. It is noted from the data that the capacitor of the present embodiment formed by the process embracing the gas flow chart A or B showed a leakage current indicating a decrease by a fall of one decimal position from the leakage current in the capacitor formed by the conventional technique.

FIG. 13 and FIG. 14 both presume the thickness of the $Ta_2O_5$ film to be 10 nm and the RTO after the growth of the $Ta_2O_5$ film 5 to be 850° C. They further presume that the $SiO_2$ convertion thickness of the $Ta_2O_5$ film grown by the gas flow chart A to be 3.2 nm, that by the gas flow chart B to be 3.18 nm, and that in the capacitor according to the conventional technique to be 3.1 nm. These film thicknesses were estimated on the basis of the C-V characteristics.

Figure 15:
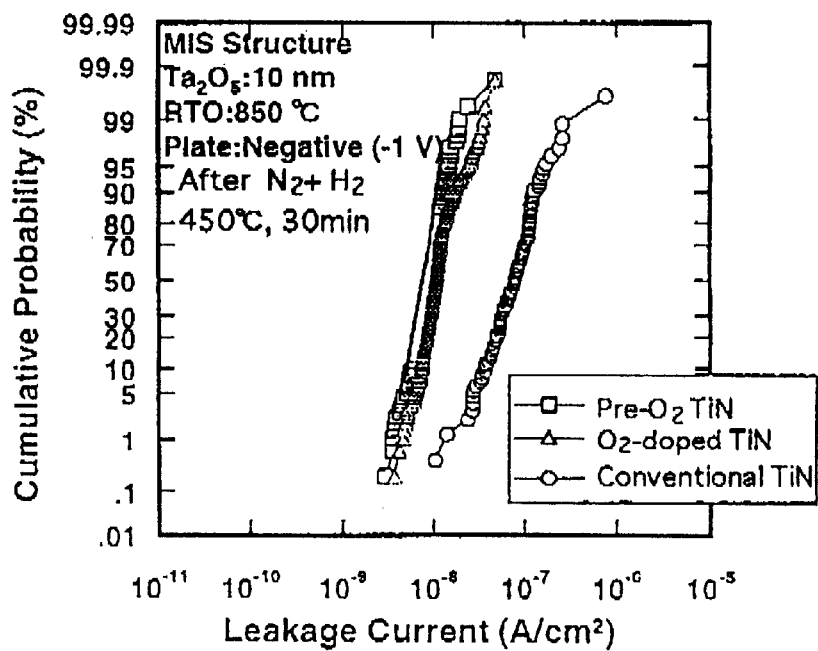
FIG. 15 is a first characteristic diagram showing the leakage current which occurs when the MIS type capacitor formed under the conditions of FIG. 13 is placed in an atmosphere of hydrogen and nitrogen at 450° C., 3 min.
Figure 16:
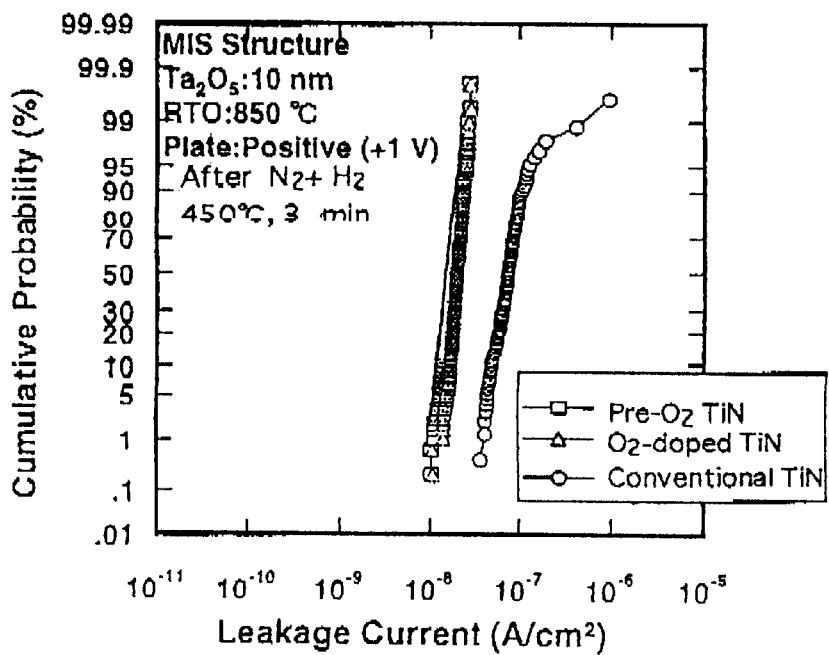
FIG. 16 is a second characteristic diagram showing the leakage current which occurs when the MIS type capacitor formed under the conditions of FIG. 14 is placed in an atmosphere of hydrogen and nitrogen at 450° C., 3 min.

An investigation conducted to find how such leakage currents would vary when the relevant upper electrodes were placed in an atmosphere containing 3% hydrogen and 97% nitrogen yielded the following data. The data of FIG. 13 varied to those of FIG. 15, indicating substantially no change. The data of FIG. 14 varied to those of FIG. 16, indicating virtually no change. It is safely concluded that the TiN film, or the TiON film isolates $Ta_2O_5$ against the reducing or deoxidizing atmosphere from oxygen.

The duration of standing of the silicon substrate 1 in the atmosphere of hydrogen and nitrogen was 30 minutes and the silicon substrate was heated at 450° C. during this standing.

Next, the outcomes of the investigation performed on the distribution of oxygen from the titanium nitride film 6 formed under the conditions of the gas flow chart A through the $Ta_2O_5$ film 5 and the distribution of oxygen from the TiN film formed by the conventional technique through the $Ta_2O_5$ film will be explained. Since the $Ta_2O_5$ film contained oxygen, a silicon substrate was used in the place of the $Ta_2O_5$ film with a view to clarifying the presence of oxygen and the titanium nitride film 6 was formed on this substrate under the conditions of the gas flow chart A.

Figure 17:
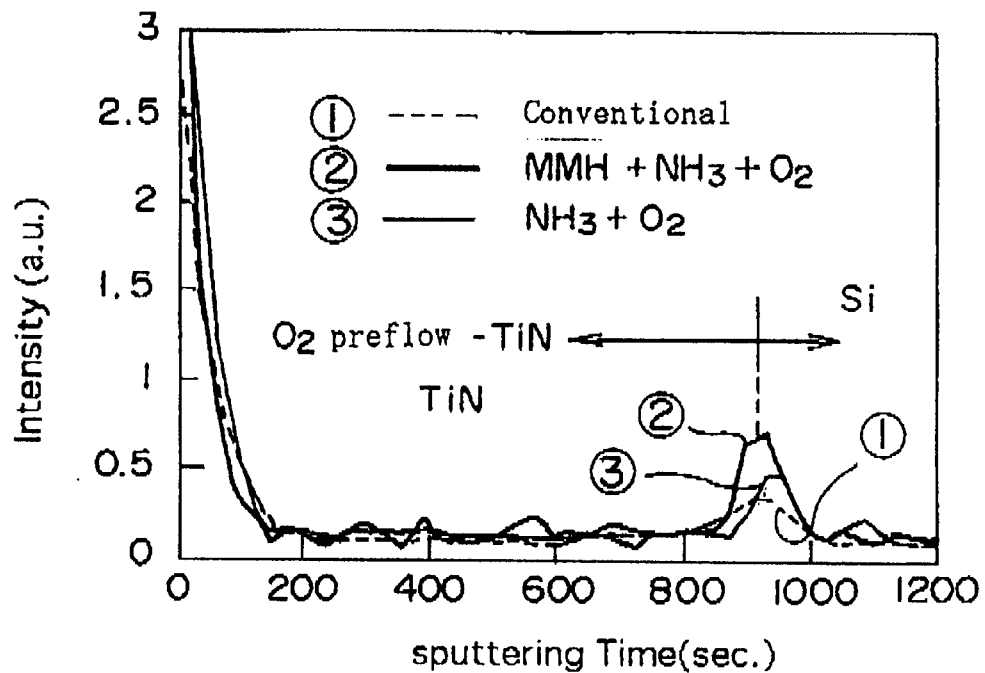
FIG. 17 is a diagram illustrating the oxygen distribution in the film of an oxygen preflow titanium nitride formed according to the charge shown in FIG. 6 and in the silicon substrate basing the film.

The experiment yielded such results of AES (auger electron spectroscopy) analysis as shown in ①–③ of FIG. 17. To be specific, the comparison of the oxygen distribution peak [① of FIG. 17] appearing in the interface between the TiN film formed by the conventional technique with the oxygen distribution peak [②] and ③ of FIG. 17] appearing in the interface between the oxygen preflow TiN film 6 of the present embodiment and the silicon substrate reveals that the peak of the present embodiment was larger.

It is noted, therefore, that the $Ta_2O_5$ film 5 (dielectric film) was precluded from the deterioration due to deficiency of oxygen) and protected against the influence of the reducing or deoxidizing atmosphere originating in $NH_3$. The molecular composition of the actually grown $Ta_2O_5$ film 5 had its constituent elements in a stoichiometric proportion. Further, the chlorine content in the oxygen preform TiN film 6 grown under the conditions of the gas flow chart A was decreased to about ⅕, the corrosion of the metal by chlorine was greatly repressed, and the fastness of contact between the TiN film 6 and the $Ta_2O_5$ film was improved the decrease of chlorine is logically explained by a supposition that the chlorine in the oxygen preflow TiN film 6 was substituted with oxygen.

It is noted from ② and ③ of FIG. 17 that the oxygen content in the interface between the oxygen preflow TiN film 6 and the silicon substrate was slightly smaller when the supply of the MMH gas shown in the gas flow chart A was omitted than when the supply of the MMH gas was not omitted. Even in the case of ③, the oxygen content was stiller larger than in the TiN film formed by the conventional technique. Thus, the omission of the MMN gas in the gas flow chart A is allowable.

Figure 18:
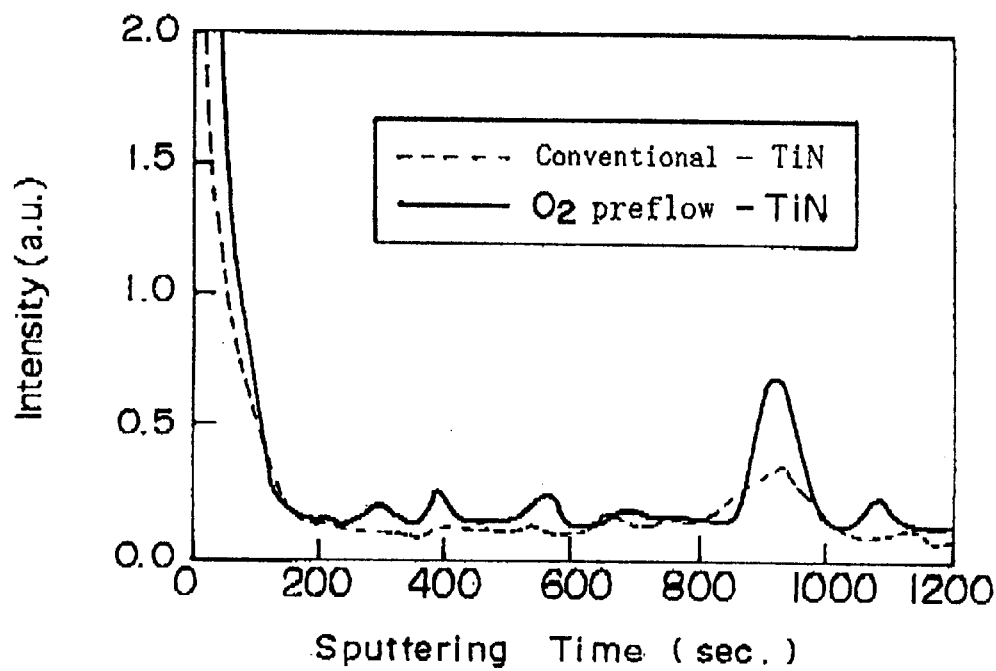
FIG. 18 is a diagram illustrating the diagram of FIG. 17, with the vertical axis drawn in an altered scale.
Figure 19:
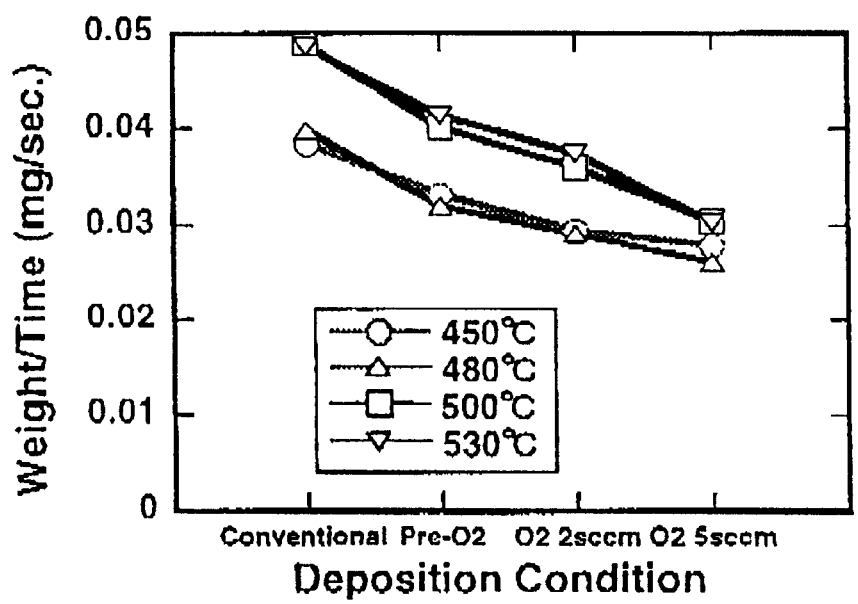
FIG. 19 is a diagram showing the difference between the oxygen content of the film of a nitridized titanium oxide to be used in this invention and the rate of growth of the film of titanium nitride according te the conventional technique.

FIG. 18 is a diagram representing FIG. 17 with the horizontal axis thereof enlarged for the sake of facilitating the comprehension of the results of ① and ②. A test of the titanium nitride film formed by oxygen preflow deposition, the TiON films, formed with the flow volume of oxygen set at 2 sccm or 5 sccm, and the titanium nitride film of the conventional technique for speed of growth yielded the data shown in FIG. 19, It is clearly noted from FIG. 19 that the growth rate decreased in accordance as the duration of introduction of oxygen to titanium nitride was elongated and the oxygen content was increased. Thus, it is safely concluded that the adoption of the oxygen preflow Ti nitride film is at an advantage in preventing the $Ta_2O_5$ film 5 from deoxidizing or reduction, precluding the leakage of oxygen from the $Ta_2O_5$ film to the titanium nitride film 6, and further maintaining the speed of growth of the upper electrode formed of titanium nitride alloy at a high level.

The embodiment, as illustrated in FIG. 4A to 4D, adopts a capacitor of the MIS structure using an amorphous silicon film 3 as the lower electrode. It is permissible, however, to form the upper electrode by adopting the conditions of FIG. 6 and FIG. 7 even in the process of producing a capacitor of the MIM (metal insulator metal) structure having the lower electrode formed of a metal.

Next, the process for the production of the capacitor of the MIM structure will be briefly described below.

First, the amorphous silicon film 3 doped with an impurity is formed on the capacitor domain en the surface of the silicon substrate 1 similarly in FIG. 4A. Thereafter, a tungsten film 10 is selectively grown in a thickness of 10 nm en the exposed surface of the amorphous silicon film 3 by the CVD method. Then, the surface of the tungsten film 10 is nitridized in an atmosphere of ammonia to allow growth of a tungsten nitride (WN) film. This nitriding film is formed for the purpose of preventing the tungsten film 10 from oxidation.

Figure 20A:
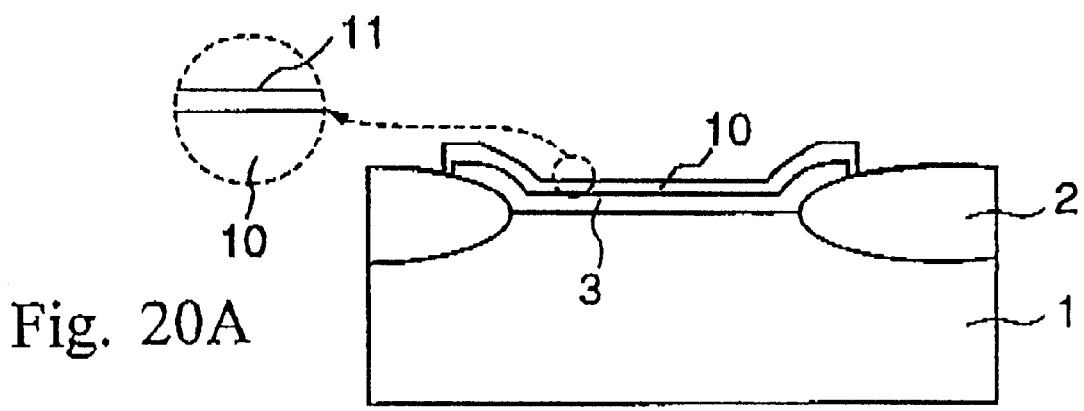
FIGS. 20A to 20D are cross sections illustrating a process for the formation of a MIM type capacitor according to an embodiment of this invention.
Figure 20B:
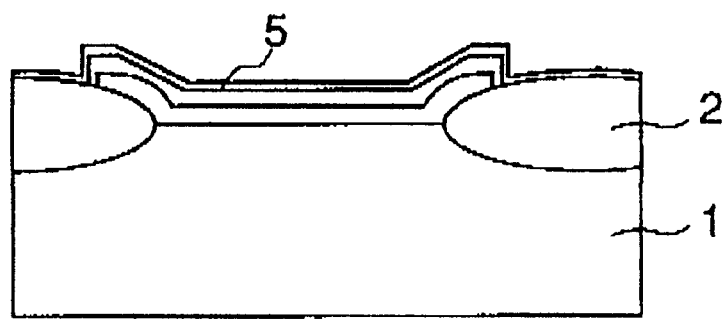

Thereafter, the $Ta_2O_5$ film 5 is grown on the tungsten film 10 and the field oxide film 2 and the surface thereof is oxidized with oxygen plasma or oxygen-containing plasma as illustrated in FIG. 20B.

Figure 20C:
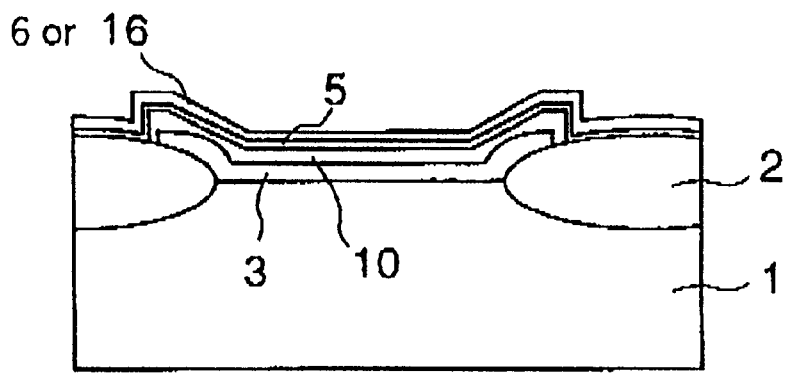
Figure 20D:
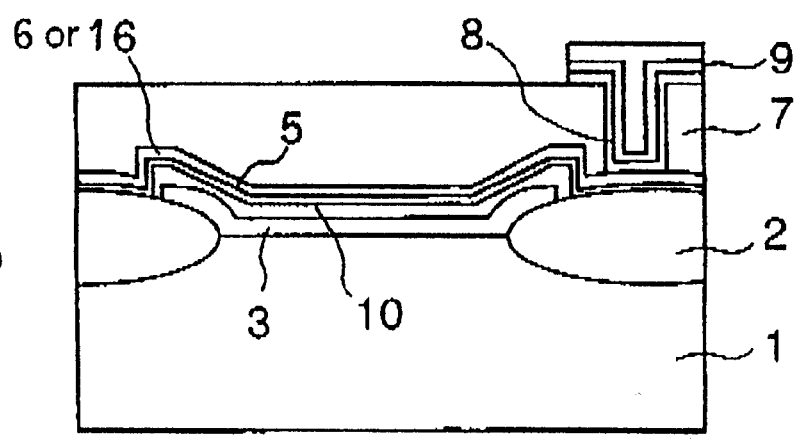

Next, the oxygen preflow TiN film 6 or the TiON film 16 is grown on the $Ta_2O_5$ film 5 as illustrated in FIG. 20C in accordance with the gas flow chart A of FIG. 6 or the gas flow chart B of FIG. 7. As a result, the basic structure of the capacitor of the MIM structure using the tungsten film 10 as the lower electrode, the $Ta_2O_5$ film 5 as the dielectric film, and the oxygen preflow TiN film 6 or the TiON film 16 as the upper electrode.

Further, the $SiO_2$ film 7 covering the capacitor is formed, then the opening part 8 for exposing part of the oxygen preflow TiN film 6 or the TiON film 16 is formed in the $SiO_2$ film, and the wiring 9 passed through the opening part 8 and connected to the oxygen preflow TiN film 6 or the TiON film 16 is formed on the $SiO_2$ film 7. The component films illustrated in FIGS. 20A to 20D have the same thicknesses as the films illustrated in FIGS. 4A to 4D, excepting the tungsten film 10.

Figure 21:
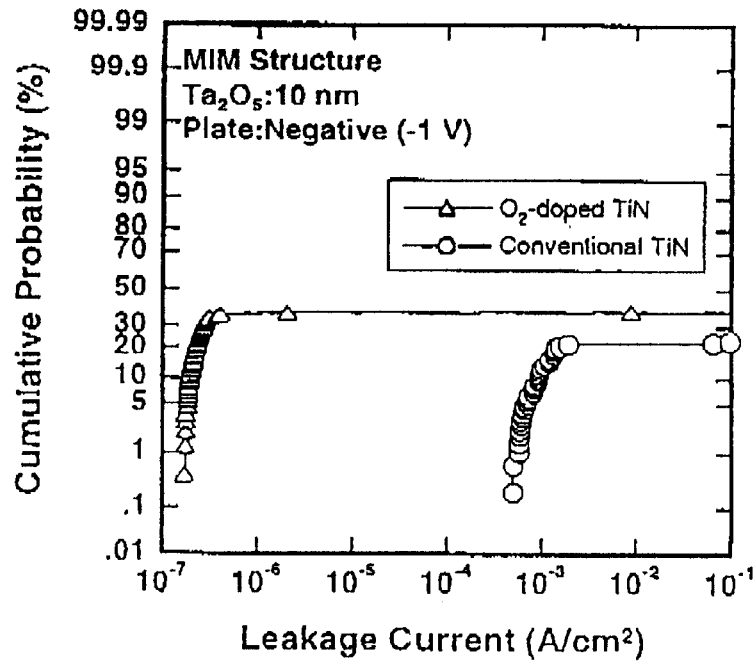
FIG. 21 is a first characteristic diagram illustrating the leakage current in the MIM type capacitor of the construction shown in FIG. 20D and in the MIM type capacitor formed by the conventional method.
Figure 22:
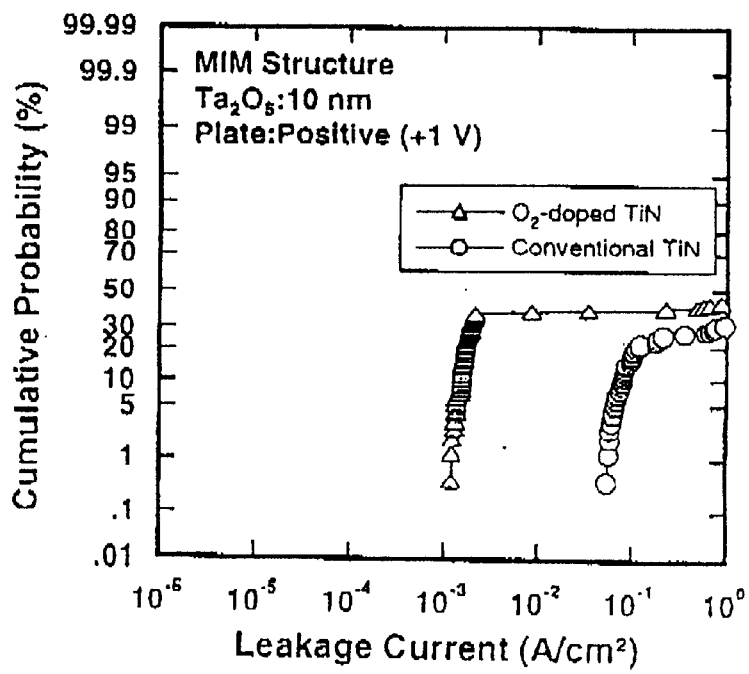
FIG. 22 is a second characteristic diagram illustrating the leakage current in the MIM type capacitor of the construction shown in FIG. 20D and in the MIM type capacitor formed by the conventional method.

The results of test shown in FIG. 21 and FIG. 22 were obtained by comparing the leakage current of the MIM type capacitor provided with the upper TiON electrode formed in accordance with the gas flow chart B shown in FIG. 7 with the leakage current of the MIM type capacitor provided with the upper TiN electrode formed. The conventional technique consists in growing the TiN film under the same conditions as shown in FIG. 7, excepting the introduction of oxygen was omitted from the process for the growth of the TiN film destined to serve as the upper electrode.

FIG. 21 shows the leakage current which occurred in the capacitor when the voltage was applied to the capacitor with the amorphous silicon film 3 on the plus side and the wiring 9 on the minus side. It is noted from the data that the MIM type capacitor of the present embodiment formed by the process embracing the gas flow chart B showed a leakage current indicating a decrease by a fall of three decimal positions from the leakage current in the capacitor formed by the conventional technique.

FIG. 22 shows the leakage current which occurred in the capacitor when the voltage was applied to the capacitor with the amorphous silicon film 3 on the minus side and the wiring 9 on the plus side. It is noted from the data that the MIM type capacitor of the present embodiment formed by the process embracing the gas flew chart B showed a leakage current indicating a decrease by a fall of two decimal positions from the leakage current in the capacitor formed by the conventional technique.

In the process illustrated in FIGS. 20A to 20D, similarly to the process illustrated in FIGS. 4A to 4D, the peak of the oxygen, content appears mostly in the interface between the TiON film 16 or the TiN film 6 and the $Ta_2O_5$ film 5, is formed in accordance with the law of stoichiometry, the amount of chlorine contained in the TiON film 16 or the TiN film 6 is decreased to about ⅕, the corrosion of the metal by chlorine is markedly repressed, and the fastness of contact between the TION film and the $Ta_2O_5$ film is improved.

The gas flow charts, as illustrated in FIG. 6 and FIG. 7, supply oxygen gas before the growth of the TiON film or the oxygen preflow TiN film. The gases containing molecules of the structure containing at least one oxygen atom such as, for example, water ($H_2O$), ozone ($O_3$), carbon monoxide (CO), carbon dioxide ($CO_2$) or nitride oxide (NO, $N_2O$, $NO_2$) may be used instead. The gas is preferred to be capable of being diluted with at least one gas selected from among helium (He), argon (Ar), or nitrogen ($N_2$).

Optionally, the oxygen-containing gas may be introduced into the atmosphere of low or vacuum pressure in the case of ruthenium, iridium, tungsten or other metal may be formed in the place of such a metal nitride film as TiON or TiN on the dielectric film.

For the dielectric film, it is permissible to use lead titanate zirconate (PZT), oxygen strontium titanate (SrTO), barium strontium titanate (BST), or strontium bismuth tantalate (SBT or Yl) in the place of the $Ta_2O_5$ or the oxides of 25 the elements of group 3A, group 4A, or group 5A in the Periodic Table of the Elements.

Where the metal film or the film of metal nitride is formed by the CVD method on the dielectric film, it is preferred to include at least one medium selected from among heat, light, and plasma in the excitation of the relevant reaction.

The MIS type or MIM type capacitor does not need to be limited to the structure described above. The capacitor whose lower electrode has a T shaped cross section, the fin type capacitor and the capacitors of the other structures may be used as occasion demands.

For the lower electrode of the capacitor, it is permissible to use ruthenium oxide ($RuO_x$), iridium oxide ($IrO_x$), titanium nitride (TiN), molybdenum (Mo), molybdenum nitride (MoN), tantalum (Ta), tantalum nitride (TaN), Ruthenium (Ru) other metal, conductive metal oxide or metal nitride in the place of tangsten nitride ($Wn_x$).

For the reducing or deoxidizing gas, it is permissible to use alkylcompound of hydrazine ($N_2H_4$) or aminecompound in the place of MMH, $NH_3$.

For the titanium compound gas, it is permissible to use titanium iodide ($TiF_4$) bromine titanium ($TiBr_4$) titanium flouride ($TiF_4$) in the place of $TiCl_4$.

Figure 23:
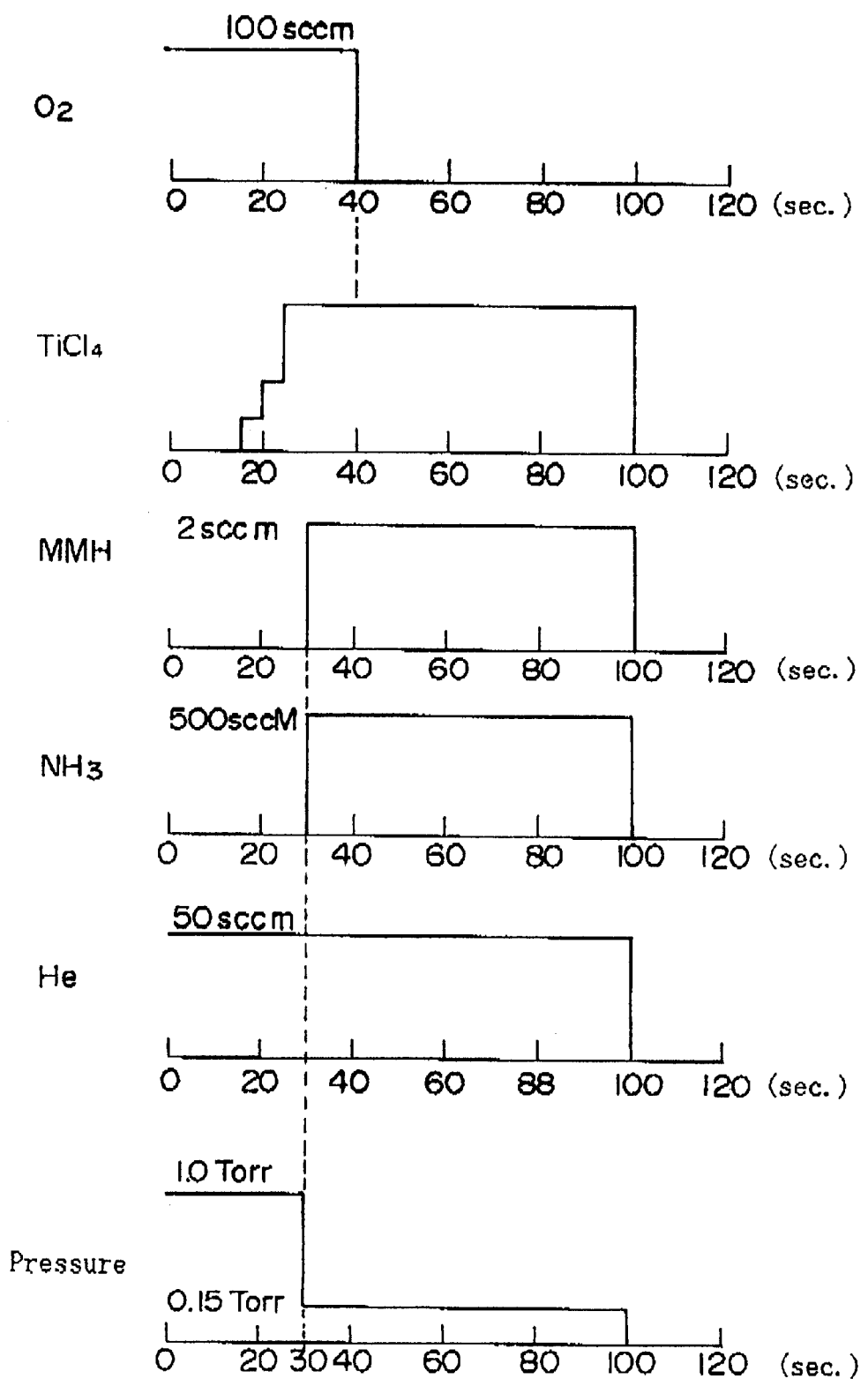
FIG. 23 is a diagram representing a third gas flow chart of the gas and pressure during the growth of a metal film and/or metal compound destined to serve as the upper electrode shown in FIG. 20D.

Incidentally, the report of T. Tamura et al. Proceedings of VMIC (1997) p. 571 proposes to avoid the exposure of $Ta_2O_5$ to a reducing or deoxidizing atmosphere by introducing $TiCl_4$ into the reaction chamber in advance of the process, when the method of introducing oxygen first is adopted as in the present invention, the order in which ammonia gas, monomethyl hydrazxiner and titanium tetrachloride are introduced to the site of reaction does not matter. The film to be produced is allowed to enjoy good step coverage by lowering the film-forming pressure. It is allowable, for example, to introduce the $TiCl_4$ gas earlier than the $NH_3$ gas and the MMH gas as illustrated in FIG. 23.

It is possible to apply the titanium nitride film formed by oxide preflow deposition method as shown in FIG. 6 and the titanium nitride oxide film formed by the method as shown in FIG. 7 to a gate electrode of a MOS transistor.

What is claimed is:

1. A method for the production of a semiconductor device, comprising the steps of;
   forming a dielectric film on or above a semiconductor substrate;
   placing said semiconductor substrate and said dielectric film in an atmosphere of low pressure; and
   introducing into said atmosphere of low pressure a reaction gas for the deposition of metal or metal nitride and an oxidizing gas thereby forming an oxygen-containing conductor film formed of metal or metal nitride on said dielectric film.

2. A method for the production of a semiconductor device according to claim 1, wherein said reaction gas has a first reaction gas and a second reaction gas, said first reaction gas is at least one of ammonia gas, alkylcompound of hydrazine and aminecompound gases; and
   said second reaction gas is at least one of $TiCl_4$, $TiI_4$, $TiBr_4$ and $TiF_4$ gases.

3. A method for the production of a semiconductor device according to claim 1, wherein said oxidizing gas is introduced into said atmosphere of low pressure prior to said reaction gas.

4. A method for the production of a semiconductor device according to claim 1, wherein the introduction of said oxidizing gas is stopped after the termination of the deposition of said conductor film and later than that of said reaction gas.

5. A method for the production of a semiconductor device according to claim 1, wherein the flow volume of said oxidizing gas is not more than 1% of the total flow volume of said reaction gas and said oxidizing gas.

6. A method for the production of a semiconductor device according to claim 1, wherein said dielectric film is formed by the deposition of the oxide of an element of group 3A, group 4A, or group 5A in the Periodic Table of the Elements or the deposition of one member selected from among lead titanium zirconate, oxygen strontium titanate, barium strontium titanate, and strontium bismuth tantalate.

7. A method for the production of a semiconductor device, comprising the step of:
   forming a dielectric film on or above a semiconductor substrate;
   introducing a oxidizing gas on said dielectric film;
   introducing a first reaction gas and a second reaction gas for depositing metal or metal nitride;
   decreasing said oxidizing gas on said dielectric film; and
   forming a conductor film including said metal or said metal nitride on said dielectric film by reacting said first reaction gas and said second reaction gas.

8. A method for the producing of semiconductor device according to claim 7, further step of;
   exposing said dielectric film in a heated atmosphere including oxide or a plasma atmosphere including oxide, after a formation of said dielectric film and before introducing said oxidizing gas on said semiconductor substrate.

9. A method for the producing of semiconductor device according to claim 7, exposing said dielectric film in a heated atmosphere including oxide or a plasma atmosphere including oxide in a first chamber; and
   introducing said oxidizing gas on said semiconductor substrate in a second chamber different from said first chamber.

10. A method for the production of a semiconductor device, comprising the steps of:
    forming a dielectric film on or above a semiconductor substrate;
    subjecting said dielectric film to improve film quality;
    exposing the surface of said dielectric film to an atmosphere of low pressure containing an oxidizing gas;
    supplying a first reaction gas and a second reaction gas for the deposition of a conductor film formed of metal or metal nitride thereby forming a metal layer including oxide or a metal nitride layer including oxide on said dielectric film in consequence of the reaction of said first reaction gas, said second reaction gas, and said oxidizing gas;
    inducing a reaction between said first reaction gas and said second reaction gas thereby forming on said dielectric film as opposed thereto across said metal layer including oxide or said metal nitride layer including oxide film said conductor film destined to form an electrode; and
    stopping the supply of said oxidizing gas midway the formation of said conductor film.

11. A method for the production of a semiconductor device according to claim 10, wherein said formation of said dielectric film consists forming an oxide dielectric substance.

12. A method for the production of a semiconductor device according to claim 11, wherein said dielectric film is formed by the deposition of the oxide of an element of group 3A, group 4A, or group 5A in the Periodic Table of the Elements or the deposition of one member selected from among lead titanium zirconate, oxygen strontium titanate, barium strontium titanate, and strontium bismuth tantalate.

13. A method for the production of a semiconductor device according to claim 10, which further comprises a step of forming between said semiconductor substrate and said dielectric film a lower electrode composed of metal, a conductive metal oxide, or a metal nitride.

14. A method for the production of a semiconductor device according to claim 13, wherein said lower electrode is formed of any member selected from among tungsten, ruthenium, ruthenium oxide, iridium oxide, titanium nitride, tungsten nitride, molybdenum, molybdenum nitride, tantalum, and tantalum nitride.

15. A method for the production of a semiconductor device according to claim 10, which further comprises a step of forming a semiconductor film containing an impurity between said semiconductor substrate and said dielectric film prior to the formation of said dielectric film.

16. A method for the production of a semiconductor device according to claim 10, wherein said oxidizing gas is a molecule gas consisting of at least one oxide.

17. A method for the production of a semiconductor device according to claim 16, wherein said oxidizing gas contains at least one member selected from among $O_2$, $H_2O$, $O_3$, CO, $CO_2$, $N_2O$, $NO_2$ or NO.

18. A method for the production of a semiconductor device according to claim 10, wherein said oxidizing gas in said atmosphere of low pressure is diluted with at least one gas selected from among helium, argon, and nitrogen.

19. A method for the production of a semiconductor device according to claim 10, wherein the step of exposing said dielectric film to said oxidizing gas in said atmosphere of low pressure is carried out in the same reaction chamber as used for the formation of said conductor film.

20. A method for the production of a semiconductor device according to claim 10, wherein the treatment for the improvement of the quality of said dielectric film is different from the step of exposing said dielectric film to the oxidizing gas in said atmosphere.

21. A method for the production of a semiconductor device according to claim 10, wherein said first reaction gas contains a deoxidizing element.

22. A method for the production of a semiconductor device according to claim 21, wherein said first reaction gas contains at least one of ammonia gas, alkylcompound of hydrazine gas, and aminecompound gas.

23. A method for the production of a semiconductor device according to claim 10, wherein said second reaction gas for the formation of said conductor film comprises oxidizing elements.

24. A method for the production of a semiconductor device according to claim 23, wherein said second reaction gas is at least $TiCl_4$, $TiI_4$, $TiBr_4$, and $TiF_4$ gases.

25. A method for the production of a semiconductor device according to claim 10, wherein said conductor film is a film of titanium nitride, a film of oxidized titanium nitride, or a two-ply film of oxidized titanium nitride and titanium nitride.

26. A method for the production of a semiconductor device, comprising the steps of:

subjecting a dielectric film to improve film quality;

exposing the surface of said dielectric film to an atmosphere of low pressure containing an oxidizing gas supplying a first reaction gas and a second reaction gas for the deposition of a conductor film formed of metal or metal nitride to said atmosphere of low pressure thereby forming on said dielectric film an upper electrode in consequence of a reaction of said first reaction gas, said second reaction gas, and said oxidizing gas; and decreasing the flow volume of said oxidizing gas midway the formation of said upper electrode.

27. A method for the production of a semiconductor device according to claim 26, wherein the supply of said oxidizing gas is stopped simultaneously with or subsequently to the stop of the supply of said first reaction gas and said second reaction gas.

28. A method for the production of a semiconductor device according to claim 26, wherein said formation of said dielectric film consists forming an oxide dielectric substance.

29. A method for the production of a semiconductor device according to claim 28, wherein said film of dielectric substance is formed by the deposition of the oxide of an element of group 3A, group 4A, or group 5A in the Periodic Table of the Elements or the deposition of one member selected from among lead titanium zirconate, oxygen strontium titanate, barium strontium titanate, and strontium bismuth tantalate.

30. A method for the production of a semiconductor device according to claim 26, which further comprises a step of forming between said semiconductor substrate and said dielectric film a lower electrode composed of metal, a conductive metal oxide, or a metal nitride.

31. A method for the production of a semiconductor device according to claim 30, wherein said lower electrode is formed of any member selected from among tungsten, ruthenium, ruthenium oxide, iridium oxide, titanium nitride, tungsten nitride, molybdenum, molybdenum nitride, tantalum, and tantalum nitride.

32. A method for the production of a semiconductor device according to claim 26, which further comprises a step of forming a semiconductor film containing an impurity between said semiconductor substrate and said dielectric film prior to the formation of said dielectric film.

33. A method for the production of a semiconductor device according to claim 26, wherein said oxidizing gas is a molecule gas consisting of at least one oxide.

34. A method for the production of a semiconductor device according to claim 33, wherein said oxidizing gas contains at least one member selected from among $O_2$, $H_2O$, $O_3$, CO, $CO_2$, $N_2O$, $NO_2$ or NO.

35. A method for the production of a semiconductor device according to claim 26, wherein said oxidizing gas in said atmosphere of low pressure is diluted with at least one gas selected from among helium, argon, and nitrogen.

36. A method for the production of a semiconductor device according to claim 26, wherein the step of exposing said dielectric film to said oxidizing gas in said atmosphere of low pressure is carried out in the same reaction chamber as used for the formation of said conductor film.

37. A method for the production of a semiconductor device according to claim 26, wherein the treatment for the improvement of the quality of said dielectric film is different from the step of exposing said dielectric film to the oxidizing gas in said atmosphere.

38. A method for the production of a semiconductor device according to claim 26, wherein said first reaction gas contains a deoxidizing element.

39. A method for the production of a semiconductor device according to claim 38, wherein said first reaction gas contains at least one of ammonia gas, alkylcompound of hydrazine gas, and aminecompound gas.

40. A method for the production of a semiconductor device according to claim 26, wherein said second reaction gas for the formation of said conductor film comprises oxidizing elements.

41. A method for the production of a semiconductor device according to claim 40, wherein said second reaction gas is at least $TiCl_4$, $TiI_4$, $TiBr_4$, and $TiF_4$ gases.

42. A method for the production of a semiconductor device according to claim 26, wherein said conductor film is a film of titanium nitride, a film of oxidized titanium nitride, or a two-ply film of oxidized titanium nitride and titanium nitride.

* * * * *